(12) United States Patent
Feng et al.

(10) Patent No.: US 11,081,058 B2
(45) Date of Patent: Aug. 3, 2021

(54) SHIFT REGISTER UNIT, GATE DRIVE CIRCUIT, DISPLAY DEVICE AND DRIVING METHOD

(71) Applicants: Hefei Xinsheng Optoelectronics Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei Xinsheng Optoelectronics Technology Co., Ltd., Hefei (CN); BOE Technology Group Co., Ltd., Beijing (CN)

(*) Notice: Subject to any disclaimer, the term of this patent is extended or adjusted under 35 U.S.C. 154(b) by 48 days.

(21) Appl. No.: 16/383,836

(22) Filed: Apr. 15, 2019

(65) Prior Publication Data
US 2020/0051507 A1    Feb. 13, 2020

(30) Foreign Application Priority Data
Aug. 10, 2018    (CN) .......................... 201810909431.8

(51) Int. Cl.
| G11C 19/00 | (2006.01) |
| G09G 3/3266 | (2016.01) |
| G11C 19/28 | (2006.01) |
| G09G 3/20 | (2006.01) |
| G09G 3/36 | (2006.01) |

(52) U.S. Cl.
CPC ............ *G09G 3/3266* (2013.01); *G09G 3/20* (2013.01); *G09G 3/3677* (2013.01); *G11C 19/28* (2013.01); *G09G 2310/0286* (2013.01); *G09G 2310/08* (2013.01); *G09G 2330/08* (2013.01)

(58) Field of Classification Search
None
See application file for complete search history.

(56) References Cited

U.S. PATENT DOCUMENTS

| 10,157,683 | B2* | 12/2018 | Jang ....................... G11C 19/28 |
| 10,547,316 | B2* | 1/2020 | Takasugi ................ H03K 21/18 |
| 10,706,767 | B2 | 7/2020 | Fan et al. |
| 2008/0002805 | A1* | 1/2008 | Tobita .................... G11C 19/28 377/64 |

(Continued)

FOREIGN PATENT DOCUMENTS

| CN | 105264592 A | 1/2016 |
| CN | 106601176 A | 4/2017 |

(Continued)

OTHER PUBLICATIONS

Nov. 3, 2020—(CN)First Office Action Appn 201810909431.8 with English Translation.

*Primary Examiner* — Tuan T Lam
(74) *Attorney, Agent, or Firm* — Banner & Witcoff, Ltd.

(57) ABSTRACT

A shift register unit, a grid drive circuit, a display device and a driving method are disclosed. The shift register unit includes a first input circuit, a first reset circuit, an anti-leakage circuit, and an output circuit. The anti-leakage circuit is connected with a first node and a second node and is configured to perform first control on the level of the second node under the control of the level of the first node so as to reduce the electrical leakage from the first node through the first reset circuit.

18 Claims, 11 Drawing Sheets

(56) References Cited

U.S. PATENT DOCUMENTS

| | | | |
|---|---|---|---|
| 2014/0354655 A1* | 12/2014 | Kim | G11C 19/28 345/501 |
| 2015/0317954 A1* | 11/2015 | Jang | G11C 19/28 345/213 |
| 2016/0253976 A1* | 9/2016 | Jang | G09G 3/3677 345/208 |
| 2016/0267854 A1* | 9/2016 | Kim | G09G 3/3466 |
| 2016/0372031 A1* | 12/2016 | Li | G11C 19/28 |
| 2017/0032733 A1* | 2/2017 | Jang | H01L 29/78633 |
| 2017/0039950 A1* | 2/2017 | Li | G09G 3/3266 |
| 2018/0149889 A1* | 5/2018 | Kim | G11C 19/28 |
| 2018/0366067 A1* | 12/2018 | Jang | G09G 3/3674 |
| 2019/0164498 A1* | 5/2019 | Jang | G09G 3/32 |
| 2020/0020266 A1* | 1/2020 | Feng | G11C 19/28 |
| 2020/0027516 A1* | 1/2020 | Feng | G09G 3/3266 |
| 2020/0035317 A1* | 1/2020 | Feng | G11C 19/287 |
| 2020/0044092 A1* | 2/2020 | Feng | H01L 29/7869 |
| 2020/0051656 A1* | 2/2020 | Feng | G11C 19/287 |
| 2020/0066211 A1* | 2/2020 | Lee | G09G 3/3275 |
| 2020/0090611 A1 | 3/2020 | Han et al. | |
| 2020/0135286 A1* | 4/2020 | Li | G09G 3/3677 |
| 2020/0168162 A1* | 5/2020 | Feng | G09G 3/3208 |
| 2020/0184872 A1* | 6/2020 | Yuan | G11C 19/287 |
| 2020/0356203 A1 | 11/2020 | Wang et al. | |

FOREIGN PATENT DOCUMENTS

| | | |
|---|---|---|
| CN | 107068077 A | 8/2017 |
| CN | 107909959 A | 4/2018 |
| CN | 108257567 A | 7/2018 |
| KR | 20160135456 A | 11/2016 |

* cited by examiner

SHIFT REGISTER UNIT, GATE DRIVE CIRCUIT, DISPLAY DEVICE AND DRIVING METHOD

CROSS REFERENCE TO RELATED APPLICATIONS

This application claims priority to and the benefit of Chinese Patent Application No. 201810909431.8 filed on Aug. 10, 2018, which application is incorporated herein in its entirety.

TECHNICAL FIELD

Embodiments of the present disclosure relate to a shift register unit, a gate drive circuit, a display device and a driving method.

BACKGROUND

In the field of display technology, a pixel array of a liquid crystal display panel or an organic light emitting diode (OLED) display panel generally includes a plurality of rows of gate lines and a plurality of columns of data lines interleaved therewith. The gate lines can be driven by a gate drive circuit. The gate drive circuit is usually integrated in a Gate IC. In IC design, chip area is the main factor that affects chip cost. How to effectively reduce chip area is a problem that technical developers need to consider.

SUMMARY

At least one embodiment of the present disclosure provides a shift register unit including a first input circuit, a first reset circuit, an anti-leakage circuit, and an output circuit. The first input circuit is connected to a first node and configured to input a first input signal to the first node in response to a first control signal; the first reset circuit is connected to the first node and a second node and is configured to reset the first node in response to a reset signal; the anti-leakage circuit is connected with the first node and the second node, and is configured to perform first control on the level of the second node under the control of the level of the first node to reduce electrical leakage from the first node through the first reset circuit; the output circuit includes an output terminal connected to the first node and configured to output an output signal to the output terminal under control of a level of the first node.

For example, the shift register unit provided by at least an embodiment of the present disclosure further includes a blocking circuit. The blocking circuit is connected with the second node and a third node, and is configured to perform second control on the level of the second node under the control of the level of the third node, wherein the first control and the second control are opposite.

For example, in the shift register unit provided by at least an embodiment of the present disclosure, the first reset circuit includes a second transistor, a third transistor, and a twenty-third transistor. The gate of the second transistor is connected to the third node, the first electrode of the second transistor is connected to the first node, and the second electrode of the second transistor is connected to the second node. The gate of the third transistor is connected to a display reset terminal to receive a display reset signal, the first electrode of the third transistor is connected to the first node, and the second electrode of the third transistor is connected to the second node; the gate of the twenty-third transistor is connected to the display reset terminal to receive the display reset signal, the first electrode of the twenty-third transistor is connected to the second node, and the second electrode of the twenty-third transistor is connected to the second voltage terminal to receive a second voltage.

For example, in the shift register unit provided by at least an embodiment of the present disclosure, the anti-leakage circuit includes a fourth transistor. The gate of the fourth transistor is connected to the first node, the first electrode of the fourth transistor is connected to the second node, and the second electrode of the fourth transistor is connected to the first voltage terminal to receive the first voltage.

For example, in the shift register unit provided in at least an embodiment of the present disclosure, the output terminal includes a shift output terminal and at least one scan signal output terminal.

For example, in the shift register unit provided in at least an embodiment of the present disclosure, the output terminal includes a shift output terminal and a scan signal output terminal, and the output circuit includes a fifth transistor, a sixth transistor, and a first capacitor. The gate of the fifth transistor is connected to the first node, the first electrode of the fifth transistor is connected to a first clock signal terminal to receive a first clock signal as the output signal, and the second electrode of the fifth transistor is connected to the shift output terminal; the gate of the sixth transistor is connected to the first node, the first electrode of the sixth transistor is connected to the first clock signal terminal to receive the first clock signal as the output signal, and the second electrode of the sixth transistor is connected to the scan signal output terminal; the first end of the first capacitor is connected to the first node, and the second end of the first capacitor is connected to the shift output terminal.

For example, in the shift register unit provided by at least an embodiment of the present disclosure, the blocking circuit includes a seventh transistor. The gate of the seventh transistor is connected to the third node, the first electrode of the seventh transistor is connected to the second node, and the second electrode of the seventh transistor is connected to the second voltage terminal to receive a second voltage.

For example, the shift register unit provided in at least an embodiment of the present disclosure further includes a first control circuit. The first control circuit is connected to the first node and the third node, and is configured to control the level of the third node under the control of the level of the first node.

For example, the shift register unit provided in at least an embodiment of the present disclosure further includes a second control circuit. The second control circuit is connected to the third node and configured to control the level of the third node in response to a second clock signal.

For example, the shift register unit provided in at least an embodiment of the present disclosure further includes a third control circuit. The third control circuit is connected to the third node and configured to control the level of the third node in response to the first control signal.

For example, the shift register unit provided by at least an embodiment of the present disclosure further includes an output noise reduction circuit. The output noise reduction circuit is connected to the third node and configured to reduce noise at the output terminal under the control of the level of the third node.

For example, in the shift register unit provided in at least an embodiment of the present disclosure, the output terminal includes a shift output terminal and a scan signal output terminal, and the output noise reduction circuit includes a thirteenth transistor and a fourteenth transistor. The gate of the thirteenth transistor is connected to the third node, the first electrode of the thirteenth transistor is connected to the shift output terminal, and the second electrode of the thirteenth transistor is connected to the second voltage terminal to receive a second voltage; the gate of the fourteenth transistor is connected to the third node, the first electrode of the fourteenth transistor is connected to the scan signal output terminal, and the second electrode of the fourteenth transistor is connected to the fifth voltage terminal to receive a fifth voltage.

For example, the shift register unit provided in at least an embodiment of the present disclosure further includes a second input circuit. The second input circuit is connected to the first node and configured to input a second input signal to the first node according to a second control signal.

For example, in the shift register unit provided by at least an embodiment of the present disclosure, the second input circuit includes a charging circuit, a storage sub-circuit, and an isolation sub-circuit. The charging circuit is connected to a blanking node and configured to input the second control signal to the blanking node in response to a third clock signal; the storage sub-circuit is connected to the blanking node and configured to store the level of the second control signal input by the charging circuit; the isolation sub-circuit is connected to the blanking node and the first node, and is configured to input the second input signal to the first node under the control of both the level of the blanking node and a second clock signal.

For example, the shift register unit provided in at least an embodiment of the present disclosure further includes a second reset circuit. The second reset circuit is connected to the first node and configured to reset the first node in response to a blanking reset signal.

At least one embodiment of the present disclosure also provides a gate drive circuit, which comprises a plurality of cascaded shift register units provided by any embodiment of the present disclosure.

For example, in the gate drive circuit provided in at least an embodiment of the present disclosure, the display control terminal of the shift register unit of (n+2)th stage is connected to the shift output terminal of the shift register unit of n-th stage; the blanking control terminal of the shift register unit of the (n+1)th stage is connected with the shift output terminal of the shift register unit of the n-th stage, where n is an integer greater than 0.

At least one embodiment of the present disclosure also provides a display device including the gate drive circuit provided in any embodiment of the present disclosure.

At least one embodiment of the present disclosure also provides a driving method of a shift register unit, which includes: in a first stage, in which the first input circuit inputs the first input signal to the first node in response to the first control signal, and at the same time, the anti-leakage circuit inputs a first voltage to the second node under the control of the level of the first node; in a second stage, the output circuit outputs the output signal to the output terminal under the control of the level of the first node.

For example, in the driving method provided by an embodiment of the present disclosure, the shift register unit includes a blocking circuit, and the driving method further includes that the blocking circuit inputting a second voltage to the second node under the control of the level of the third node; the first voltage and the second voltage are different.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
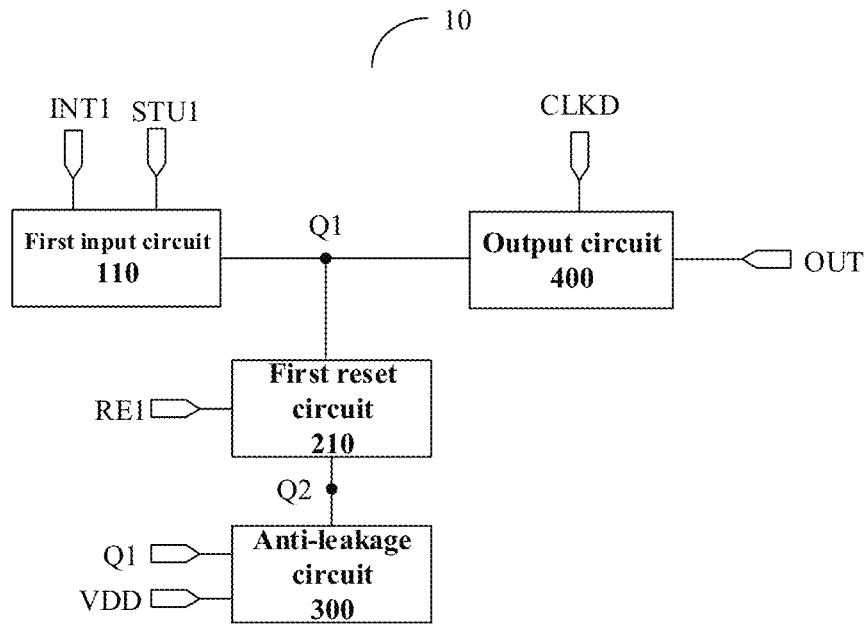
FIG. 1 is a schematic diagram of a shift register unit according to at least an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure will be described below by several specific examples. In order to keep the following description of embodiments of the present disclosure clear and concise, detailed descriptions of known functions and known components may be omitted. When any component of an embodiment of the present disclosure appears in more than one drawing, the component is denoted by the same reference number in each drawing.

In common OLED display panels, compensation technology is needed to improve display quality. For compensating the sub-pixel units in the OLED display panel, in addition to internal compensation by setting a pixel compensation circuit in sub-pixel units, external compensation can also be performed by setting a sensing transistor. When performing external compensation, the gate drive circuit formed by shift register units needs to provide drive signals for the scanning transistors and the sensing transistors to the sub-pixel units in the display panel, respectively, for example, a scanning drive signal (i.e., a display output signal) for the scanning transistor is provided in a display period of one frame, and a sensing drive signal (i.e., a blanking output signal) for the sensing transistor is provided in a blanking period of one frame.

On one hand, transistors may experience negative drift due to the influence of the transistor manufacturing process; on the other hand, with the increase of the working time of the gate drive circuit, transistors that have long been controlled by high voltage are prone to be under negative bias thermal stress (NBTS) for a long time, which leads to negative drift of the threshold voltage. If the transistor connected to the pull-up node has suffered from negative drift, it will be difficult to keep the charged level of the pull-up node due to electrical leakage of the transistor with negative drift, thus causing no output or abnormal output of the gate drive circuit.

An embodiment of the present disclosure provides a shift register unit, which comprises a first input circuit, a first reset circuit, an anti-leakage circuit, and an output circuit. A first input circuit is connected to a first node and configured to input a first input signal to the first node in response to a first control signal; the first reset circuit is connected with the first node and a second node, and is configured to reset the first node in response to a reset signal; the anti-leakage circuit is connected with the first node and the second node, and is configured to perform first control on the level of the second node under the control of the level of the first node so as to reduce the electrical leakage from the first node through the first reset circuit; the output circuit includes an output terminal, and is connected to the first node and configured to output an output signal to the output terminal under the control of the level of the first node. The embodiments of the present disclosure also provide a gate drive circuit, a display device and a driving method corresponding to the shift register unit.

The circuit structure of the shift register unit provided by the above embodiment of the present disclosure is simple, which can avoid the leakage phenomenon caused by the threshold voltage drift of the transistor at the charged level of the first node, thereby avoiding the occurrence of output abnormality and enhancing the reliability of the circuit.

Embodiments of the present disclosure and examples thereof will be described in detail below with reference to the accompanying drawings.

FIG. 1 is a schematic diagram of a shift register unit according to an embodiment of the present disclosure. As shown in FIG. 1, the shift register unit 10 may include a first input circuit 110, a first reset circuit 210, an anti-leakage circuit 300, and an output circuit 400. A gate drive circuit can be obtained by cascading a plurality of the shift register units 10, and the gate drive circuit is used for driving a display panel and sequentially providing scanning signals for a plurality of gate lines of the display panel, thereby performing progressive or interlaced scanning and the like during the display panel displaying a frame of picture.

As shown in FIG. 1, the first input circuit 110 is connected to the first node Q1 (for example, a pull-up node here) and is configured to output a first input signal to the first node Q1 in response to a first control signal. For example, in some examples, the first input circuit 110 is connected to a first input signal terminal INT1, a display control terminal STU1 and the first node Q1, and is configured to be turned on under the control of the first control signal provided by the display control terminal STU1 to connect the first input signal terminal INT1 and the first node Q1, so that the first input signal provided by the first input signal terminal INT1 is input to the first node Q1 to pull up the potential of the first node Q1 to the operating potential.

Figure 3:
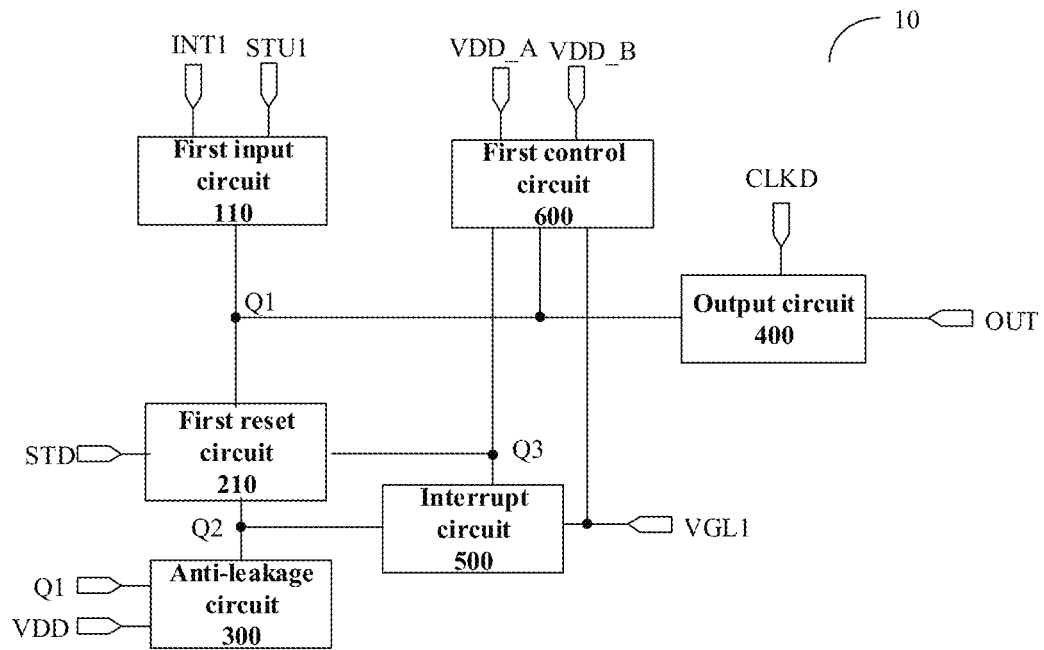
FIG. 3 is a schematic diagram of still another shift register unit according to at least an embodiment of the present disclosure.

The first reset circuit 210 is connected to the first node Q1 and the second node Q2, and is configured to reset the first node Q1 in response to a reset signal. For example, the first reset circuit 210 is connected to the reset control terminal RE1, the first node Q1, the second node Q2, and the second voltage terminal (not shown in the figure, for example, the low voltage terminal), and is configured to conduct under the control of the reset signal provided by the reset control terminal RE1, so that the first node Q1 is connected to the second node Q2 (for example, the second node Q2 is at a low level at this time) or other provided voltage terminal (for example, the low voltage terminal) to pull down the potential of the first node Q1 to a non-operating potential, and reset the first node Q1 to realize noise reduction. For example, in one example, as shown in FIG. 3, the reset terminal RE1 includes a display reset terminal STD and a third node Q3 (for example, a pull-down node here), accordingly, the reset signal includes the display reset signal and the level of the third node Q3. The specific structure of the reset signal will be described in detail in the following example and will not be described here.

The leakage prevention circuit 300 is connected to the first node Q1 and the second node Q2, and is configured to perform first control on the level of the second node Q2 under the control of the level of the first node Q1, to reduce electrical leakage from the first node Q1 through the first reset circuit 210. For example, the leakage prevention circuit 300 is connected to the first node Q1, the second node Q2, and the first voltage terminal VDD (e.g., providing a high voltage) or otherwise provided voltage terminal (e.g., a high voltage terminal) (the connection line with the first node Q1 is omitted in the figure), and is configured to be conductive when the first node Q1 is, for example, at an operating voltage (e.g., a high level) to allow the second node Q2 to be connected to the first voltage terminal VDD. For example, the anti-leakage circuit 300 is turned on in response to the high level of the first node Q1, so that the voltage difference between the two ends of the first reset circuit 210 (the first node Q1 and the second node Q2) becomes small, e.g., both are high level, thereby avoiding leakage of the charged level of the first node Q1 through the first reset circuit 210.

The output circuit 400 includes an output terminal OUT, is connected to the first node Q1 and configured to output an output signal to the output terminal OUT under the control of the level of the first node Q1. For example, in some examples, the output circuit 400 is connected to the first node Q1, the output terminal OUT, and a first clock signal terminal CLKD, and is configured to be turned on under the control of the level of the first node Q1, such that the first clock signal provided by the first clock signal terminal CLKD is output to the output terminal OUT as an output signal.

For example, the output terminal OUT includes a shift output terminal CR and at least one scan signal output terminal, thereby outputting an output signal such as a first clock signal provided by a first clock signal terminal CLKD to the shift output terminal and the scan signal output terminal, respectively, to improve the driving capability of the shift register unit 10. For example, at least one scan signal output includes one scan signal output. For example, the shift output CR is used to provide a first input signal, a second input signal (to be described later) and a reset signal to the shift register unit 10 of the next stage, and the scan signal output is used to provide a drive signal to the pixel circuits of a row of pixel units in the display panel. For example, the shift output CR and the scan signal output terminal output the same output signal. It should be noted that in other examples, when a plurality of scanning signal output terminals are included, each scanning signal output terminal may also output different output signals, and the specific settings are determined according to actual conditions, and the embodiments of the present disclosure are not limited to this.

According to the shift register unit provided by the embodiment of the disclosure, on one hand, in order to avoid the leakage phenomenon caused by the threshold voltage drift of the transistor in the first reset circuit 210 at the charged level of the first node Q1, the voltage difference between the two ends of the first reset circuit 210 is reduced by controlling the level of the second node Q2 connected to the other end of the first reset circuit 210, e.g., both are at a high level, thereby ensuring that the charged level of the first node remains unchanged to avoid the output abnormality and enhancing the reliability of the shift register unit (and the thus resulted gate drive circuit); on the other hand, the anti-leakage circuit has a simple circuit structure, can reduce the cost without increasing the chip area, and is beneficial to realize high resolution and narrow frame of the display panel.

Figure 2:
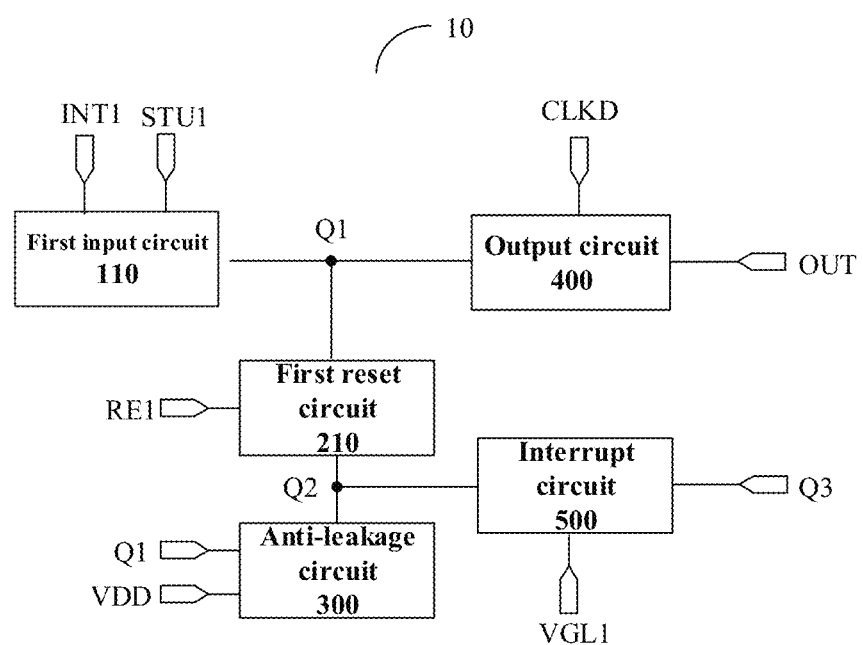
FIG. 2 is a schematic diagram of another shift register unit according to at least an embodiment of the present disclosure.

FIG. 2 is a schematic block diagram of another shift register unit provided by an embodiment of the disclosure. As shown in 2, the shift register unit 10 further includes a blocking circuit 500 and for example further includes a third node Q3. It should be noted that other circuit structures of the shift register unit 10 shown in FIG. 2 are basically the same as those of the shift register unit 10 shown in FIG. 1, and repetition thereof will not be repeated.

As shown in FIG. 2, the blocking circuit 500 is connected to the second node Q2 and the third node Q3, and is configured to perform a second control on the level of the second node Q2 under the control of the level of the third node Q3, for example, the first control is opposite to the second control, that is, opposite to the operation (pull-up or pull-down) by the second node Q2. For example, in one example, the blocking circuit 500 is connected to the second voltage terminal VGL1 (e.g., providing a low level) or a separately provided voltage terminal (e.g., a low voltage terminal), the second node Q2, and the third node Q3, and is configured to connect the second node Q2 with the second voltage terminal VGL1 under the control of the level of the third node Q3 to realize pull-down of the second node Q2, thereby realizing reset of the second node Q2 when the first reset circuit 210 is turned on in response to the level of the third node Q3 or a display reset signal. For example, the first control is the control to pull up the level of the second node Q2 (for example, to pull up the level of the second node Q2), and the second control is the control to pull down the level of the second node Q2 (for example, to pull down the level of the second node Q2).

FIG. 3 is a schematic block diagram of yet another shift register unit provided by an embodiment of the disclosure. As shown in FIG. 3, the shift register unit 10 further includes a first control circuit 600. It should be noted that other circuit structures of the shift register unit 10 shown in FIG. 3 are basically the same as those of the shift register unit 10 shown in FIG. 2, and repetition thereof will not be repeated.

It should be noted that, for the sake of clarity, the specific structure of the reset control terminal RE1 is shown in FIG. 3, i.e., the reset terminal STD and the third node Q3 are displayed.

As shown in FIG. 3, the first control circuit 600 is connected to the first node Q1 and the third node Q3, and is configured to control the level of the third node Q3 under the control of the level of the first node Q1. For example, the first control circuit 600 is connected to the third voltage terminal VDD_A, the fourth voltage terminal VDD_B, the second voltage terminal VGL1 (e.g., the low voltage terminal), the first node Q1, and the third node Q3, and is configured to connect the third node Q3 to the second voltage terminal VGL1 or another voltage terminal (e.g., the low voltage terminal) when the first node Q1 is at a high level, for example, to pull down the third node Q3 to a low level, and to connect the third node Q3 to one of the third voltage terminal VDD_A and the fourth voltage terminal VDD_B when the first node Q1 is at a low level, thereby pulling up the third node Q3 to a high level. For example, the first control circuit 600 may be an inverter. For example, the third voltage terminal VDD_A and the fourth voltage terminal VDD_B may be set to alternately input a high level, i.e., when the third voltage terminal VDD_A inputs a high level, the fourth voltage terminal VDD_B inputs a low level, while when the third voltage terminal VDD_A inputs a low level, the fourth voltage terminal VDD_B inputs a high level, so that transistors connected thereto can alternately operate to prolong the service life of these transistors. For example, in another example, the third voltage terminal VDD_A and the fourth voltage terminal VDD_B may also be replaced by clock signal terminals alternately providing high levels (DC low levels when the implemented transistor are of P-type), and the embodiments of the present disclosure are not limited thereto.

For example, the first voltage terminal VDD is configured to provide a DC high-level signal (e.g., higher than or equal to the high-level portion of the clock signal), and the DC high-level signal is referred to herein as the first voltage; for example, the following embodiments are the same as the above and will not be described again.

For example, the second voltage terminal VGL1 is configured to provide a DC low-level signal (e.g., lower than or equal to the low-level portion of the clock signal), such as is grounded. Here, the DC low-level signal is referred to as a second voltage, e.g., the second voltage is lower than the first voltage. The following embodiments are the same as the above and will not be described again.

For example, the third voltage terminal VDD_A is configured to provide a DC high-level signal, and the signal provided by the third voltage terminal VDD_A is referred to as the third voltage. The fourth voltage terminal VDD_B is also configured to provide a DC high-level signal, and the signal provided by fourth voltage terminal VDD_B is referred to as the fourth voltage; the following embodiments are the same as the above and will not be described again.

Figure 4:
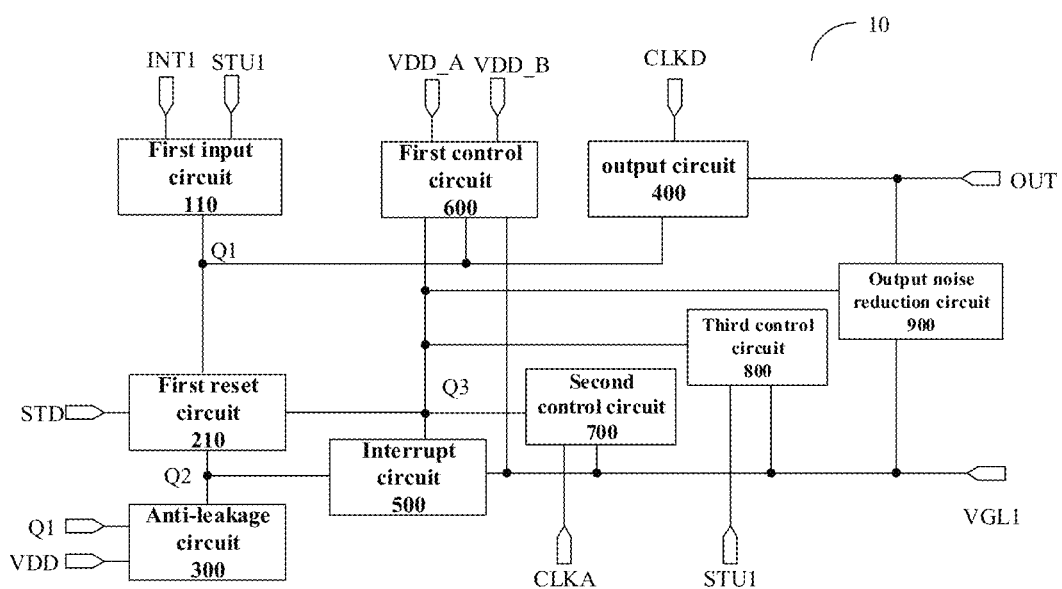
FIG. 4 is a schematic diagram of further another shift register unit according to at least an embodiment of the present disclosure.

FIG. 4 is a schematic block diagram of yet another shift register unit provided by an embodiment of the present disclosure. As shown in FIG. 4, in one example, the shift register unit 10 further includes a second control circuit 700. It should be noted that other circuit structures of the shift register unit 10 shown in FIG. 4 are basically the same as those of the shift register unit 10 shown in FIG. 3, and repetition thereof will not be repeated here.

The second control circuit 700 is connected to the third node Q3 and is configured to control the level of the third node Q3 in response to the second clock signal. For example, the second control circuit 700 is connected to the third node Q3, the second voltage terminal VGL1, and the second clock signal terminal CLKA, and is configured to conduct under the control of the second clock signal provided by the second clock signal terminal CLKA during a blanking period of one frame, so that the third node Q3 is electrically connected to the second voltage terminal VGL1 or a separately provided voltage terminal (e.g., a low voltage terminal), thereby pulling down the third node Q3 to a non-operating potential.

In the case where the circuit structure does not include the second control circuit 700, the threshold voltages of the transistors in the circuit tend to drift after the shift register unit operates for a long time. Therefore, the high level written to the first node Q1 through the second input circuit 120 will be lower than a predetermined value, making it difficult to pull down the third node Q3 through the first control circuit 600, and further affecting the output signal of the output terminal OUT. The second control circuit 700 provided in this example can pull down the third node Q3 in the blanking period of one frame to ensure that the third node Q3 is at a low level, which is helpful for the second input circuit 220 to write a high level to the first node Q1, so that the high level of the first node Q1 reaches the predetermined value, thus preventing the output signal from being affected after the transistor threshold voltage drifts, and enhancing the reliability of the circuit.

As shown in FIG. 4, in another example, the shift register unit 10 further includes a third control circuit 800.

The third control circuit 800 is connected to the third node Q3 and is configured to control the level of the third node Q3 in response to the first control signal. For example, the third control circuit 800 is connected to the third node Q3 and the display control terminal STU2, and is configured to conduct under the control of the first control signal provided by the display control terminal STU2 during a display period of one frame, so that the third node Q3 is electrically connected to the second voltage terminal VGL1 or a separately provided voltage terminal (e.g., a low voltage terminal), thereby pulling down the third node Q3 to a non-operating potential.

In the case where the circuit structure does not include the third control circuit 800, the threshold voltages of the transistors in the circuit tend to drift after the shift register unit is operated for a long time, so the high level written to the first node Q1 through the first input circuit 110 will be lower than a predetermined value, which makes it difficult to pull down the third node Q3 through the first control circuit 600 and further affects the output signal of the output terminal OUT. The third control circuit 800 provided in this example can pull down the third node Q3 in a display period of one frame to ensure that the third node Q3 is at a low level, which is helpful for the first input circuit 110 to write a high level to the first node Q1, so that the high level of the first node Q1 reaches the predetermined value, thus preventing the output signal from being affected after the transistor threshold voltage drifts, and enhancing the reliability of the circuit.

It should be noted that the shift register unit 10 may include only the first control circuit 600, or include any one of the first control circuit 600, the second control circuit 700, and the third control circuit 800, and the embodiments of the present disclosure are not limited thereto.

As shown in FIG. 4, in another example, the shift register unit 10 further includes an output noise reduction circuit 900.

The output noise reduction circuit 900 is connected to the third node Q3 and is configured to reduce noise at the output terminal OUT under the control of the level of the third node Q3. For example, the output noise reduction circuit 900 is connected to the third node Q3, the second voltage terminal VGL1, and the output terminal OUT, and is configured to conduct when the third node Q3 is, for example, at a high level, so that the output terminal OUT is connected to the second voltage terminal VGL1 to realize noise reduction of the output terminal OUT.

Figure 5:
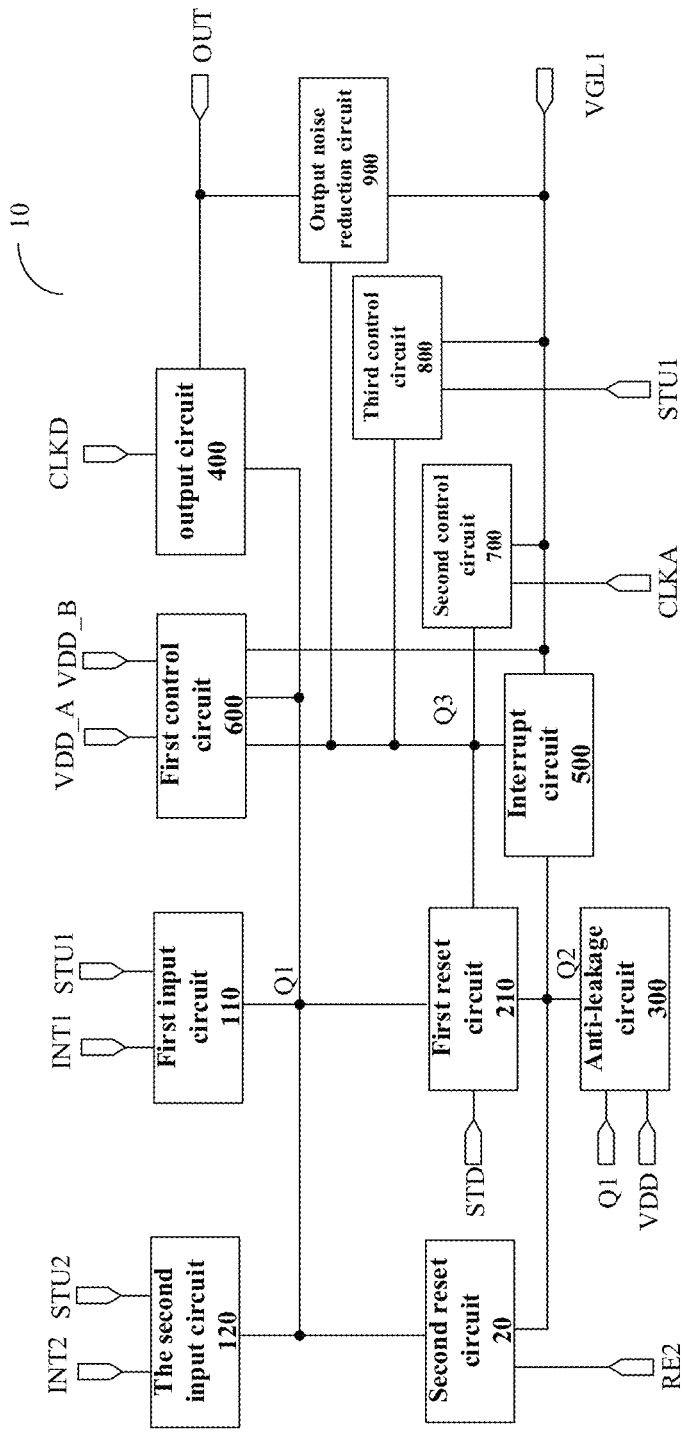
FIG. 5 is a schematic diagram of further still another shift register unit according to at least an embodiment of the present disclosure.

FIG. 5 is a schematic block diagram of yet another shift register unit provided by an embodiment of the present disclosure. As shown in FIG. 5, in one example, the shift register unit 10 further includes a second input circuit 220. It should be noted that other circuit structures of the shift register unit 10 shown in FIG. 5 are basically the same as those of the shift register unit 10 shown in FIG. 4, and repetition thereof will not be repeated here.

The second input circuit 220 is connected to the first node Q1 and is configured to input a second input signal to the first node Q1 according to a second control signal. For example, the second input circuit 220 is electrically connected to the blanking control terminal STU2, the second input signal terminal INT2, and the first node Q1, and is configured to receive and store the second control signal provided by the blanking control terminal STU2, and output the second input signal provided by the second input signal terminal INT2 to the first node Q1 according to the second control signal during the blanking period of one frame, thereby pulling up the potential of the first node Q1 to the operating potential.

For example, in one example, the second input circuit 220 may receive and store a second control signal during a display period of one frame, and output a second input signal to the first node Q1 according to the stored second control signal during a blanking period of this frame, thereby pulling up the potential of the first node Q1 to an operating potential. For example, in another example, the second input circuit 220 may receive and store a second control signal during a blanking period of one frame, and output a second input signal to the first node Q1 according to the stored second control signal during a blanking period of the next frame, thereby pulling up the potential of the first node Q1 to an operating potential.

In the shift register unit 10 provided by the embodiment of the present disclosure, the first input circuit 110 (implemented as a display scanning sub-circuit), the output circuit 400, and the second input circuit 220 (implemented as a detection sub-circuit) can be integrated. When a display panel is driven by the gate drive circuit obtained by cascading a plurality of shift register units 10, then the blanking scan signal in the blanking period and the display scan signal in the display period of one frame of picture can be output through the same output circuit, that is, the first input circuit 110 and the second input circuit 220 can share the same output circuit 400 to realize the output of the output signals, thereby simplifying the circuit structure of the shift register unit and the gate drive circuit thus obtained, reducing the size of the shift register unit and the gate drive circuit including the shift register units, and meeting the requirements of high resolution and narrow frame.

For example, in this example, the first clock signal provided by the first clock signal terminal CLKD is a composite signal. For example, the first clock signal may include a first output signal output during a display period and a second output signal output during a blanking period. For example, the first output signal and the second output signal may be two mutually independent waveforms having different widths and timings. For example, in the display period of one frame, the output circuit 400 outputs a first output signal via the output terminal OUT under the control of the level of the first node Q1 to drive the scanning transistor for data input in the corresponding pixel unit through the gate line connected thereto, thereby performing display; in the blanking period of one frame, the output circuit 400 outputs a second output signal via the output terminal OUT under the control of the level of the first node Q1 to drive the sensing transistor for compensation detection in the pixel unit, thereby performing compensation detection.

As shown in FIG. 5, in another example, the shift register unit 10 further includes a second reset circuit 220. The second reset circuit 220 is connected to the first node Q1 and is configured to reset the first node Q1 in response to a blanking reset signal. For example, the second reset circuit 220 is connected to the blanking reset signal terminal RE2, the second node Q2, the first node Q1, and the second voltage terminal (not shown in the figure, for example, the low voltage terminal), and is configured to be turned on under the control of the blanking reset signal provided by the blanking reset signal terminal RE2, so that the first node Q1 is electrically connected to the second node Q2 (at a low level) or otherwise provided voltage terminal (for example, the low voltage terminal) to reset the first node Q1. For example, in the blanking period of one frame, when the output circuit 400 completes signal output, the first node Q1 is reset by the second reset circuit 220.

Figure 6:
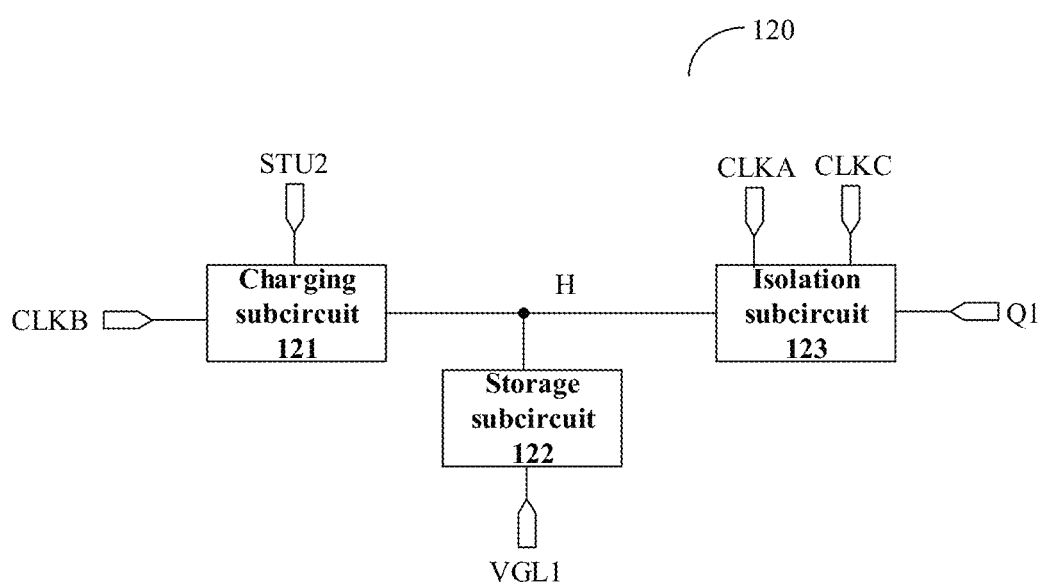
FIG. 6 is a schematic diagram of an exemplary second input circuit according to at least an embodiment of the present disclosure.

FIG. 6 is a schematic diagram of an exemplary second input circuit according to an embodiment of the present disclosure. As shown in FIG. 6, the second input circuit 220 includes a charging circuit 121, a storage sub-circuit 122, an isolation sub-circuit 123, and further includes a blanking node H.

As shown in FIG. 6, the charging circuit 121 is connected to the blanking node H and is configured to input a second control signal to the blanking node H in response to a third clock signal. For example, the charging circuit 121 is connected to the third clock signal terminal CLKB, the blanking control terminal STU2, and the blanking node H, and is configured to be turned on under the control of the third clock signal provided by the third clock signal terminal CLKB to electrically connect the blanking control terminal STU2 and the blanking node H, thereby writing the second control signal to the blanking node H. For example, in one example, the charging circuit 121 is turned on under the control of the third clock signal, and when the second control signal is at a high level, the blanking node H is charged.

The storage sub-circuit 122 is connected to the blanking node H and is configured to store the level of the second control signal input from the charging circuit 121. For example, the other end of the storage sub-circuit 122 is further connected to the second voltage terminal VGL1 to store the level of the second control signal. It should be noted that the other end of the storage sub-circuit 121 may also be connected to the isolation sub-circuit 123, and the embodiments of the present disclosure are not limited to this.

The isolation sub-circuit 123 is connected to the blanking node H and the first node Q1, and is configured to input a second input signal to the first node Q1 under the control of the level of the blanking node H and the second clock signal. For example, the isolation sub-circuit 123 is connected to the blanking node H, the first node Q1, the fourth clock signal terminal CLKC (i.e., the second input signal terminal INT2) and the second clock signal terminal CLKA, and is configured to be turned on under the joint control of the level of the blanking node H and the second clock signal provided by the second clock signal terminal CLKA, so that the fourth clock signal terminal CLKC and the first node Q1 are electrically connected, thereby inputting the fourth clock signal (i.e., the second input signal) to the first node Q1. For example, in one example, the isolation sub-circuit 123 is turned on under the joint control of the level of the blanking node H and the second clock signal, and the first node Q1 can be charged when the fourth clock signal is at a high level.

It should be noted that in the embodiments of the present disclosure, the blanking input circuit 120 may include any suitable sub-circuit(s), not limited to the charging circuit 121, the storage sub-circuit 122 and the isolation sub-circuit 123 that are described above, as long as corresponding functions can be realized.

Figure 7:
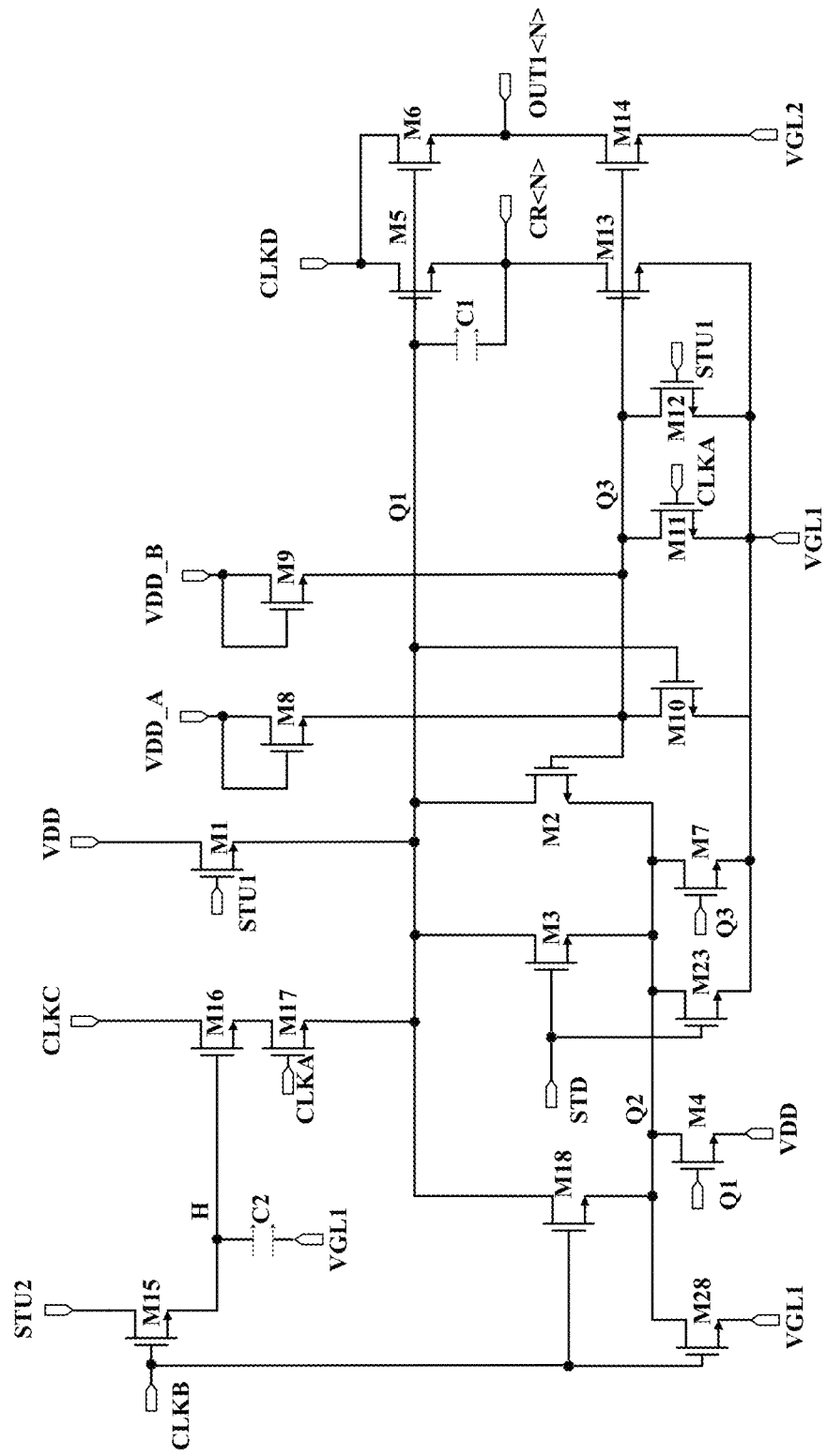
FIG. 7 is a circuit diagram of a specific implementation example of the shift register unit shown in FIG. 5.

FIG. 7 is a circuit diagram of one specific implementation example of the shift register unit shown in FIG. 5. As shown in FIG. 7, the shift register unit 10 includes first to eighteenth transistors M1 to M18, and further includes first to second capacitors C1 to C2. It should be noted that in the following description, each transistor is illustrated as an N-type transistor, but this does not constitute a limitation to the embodiments of the present disclosure.

As shown in FIG. 7, in this example, the first input circuit 110 may be implemented as a first transistor M1 in more detail. In one example, as shown in FIG. 7, the gate of the first transistor M1 is connected to the display control terminal STU1 to receive the first control signal, the first electrode of the first transistor M1 is connected to the first voltage terminal VDD (i.e., the first input terminal INT1) to receive the first voltage as the first input signal, and the second electrode of the first transistor M1 is connected to the first node Q1. When the first control signal is at an effective level (e.g., high level), the first transistor M1 is turned on to electrically connect the first voltage terminal VDD to the first node Q1, thereby writing the first voltage to the first node Q1 and pulling up the potential of the first node Q1 to the operating potential. In another example, as shown in FIG. 8A, the gate of the first transistor M1 may also be connected to the first electrode and connected to the display control terminal STU1 to receive the first control signal, and the second electrode of the first transistor M1 is connected to the first node Q1, the embodiments of the present disclosure are not limited to this.

The first reset circuit 210 may be implemented as a second transistor M2, a third transistor M3, and a twenty-third transistor M23. The gate of the second transistor M2 is connected to the third node Q3, the first electrode of the second transistor M2 is connected to the first node Q1, and the second electrode of the second transistor M2 is connected to the second node Q2. The gate of the third transistor M3 is connected to the display reset terminal STD to receive the display reset signal, the first electrode of the third transistor M3 is connected to the first node Q1, the second electrode of the third transistor M3 is connected to the second node Q2, the gate of the twenty-third transistor M23 is connected to the display reset terminal STD to receive the display reset signal, the first electrode of the twenty-third transistor M23 is connected to the second node Q2, and the second electrode of the twenty-third transistor M23 is connected to the second voltage terminal VGL1 to receive the second voltage. For example, when the display reset signal and the third node Q3 are at an effective level (e.g., high level), the second transistor M2, the third transistor M3, and the twenty-third transistor M23 are all turned on, electrically connecting the first node Q1 and the second node Q2 (at this time, low level) with the second voltage terminal VGL1, thereby resetting the first node Q1.

The leakage prevention circuit 300 may be implemented as the fourth transistor M4. The gate of the fourth transistor M4 is connected to the first node Q1, the first electrode of the fourth transistor M4 is connected to the second node Q2, and the second electrode of the fourth transistor M4 is connected to the first voltage terminal VDD to receive the first voltage. When the first node is at an effective level (e.g., high level), the fourth transistor M4 is turned on, so that the second node Q2 and the first voltage terminal VDD are connected, thereby writing the first voltage to the second node Q2, so that both ends of the first reset circuit 210 (i.e., both ends of the second transistor M2 and the third transistor M3) are at high levels, thereby preventing electrical leakage from the first node Q1 by reducing the voltage difference across the first reset circuit 210.

Figure 8A:
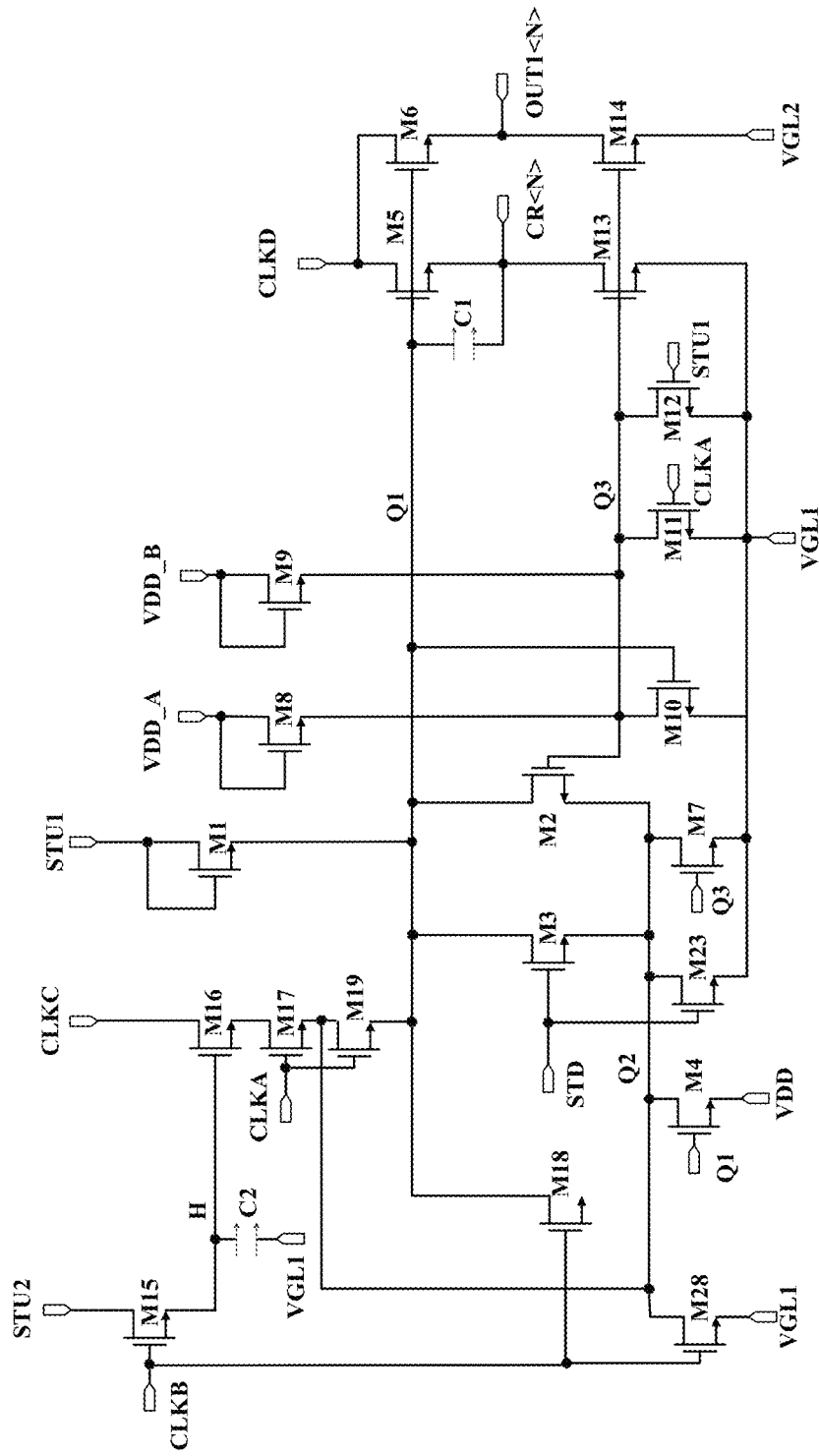
FIG. 8A is a circuit diagram of another specific implementation example of the shift register unit shown in FIG. 5.

In another example, as shown in FIG. 8A, in order to prevent the high level of the first node Q1 from leaking through the seventeenth transistor M17 during the blanking period, the leakage prevention circuit may further include a nineteenth transistor M19. The gate of the nineteenth transistor M19 is connected to the second clock signal terminal CLKA to receive the second clock signal, the first electrode of the nineteenth transistor M19 is connected to the second electrode of the seventeenth transistor M17 and the second node Q2, and the second electrode of the nineteenth transistor M19 is connected to the first node Q1, so that, when the first node Q1 is at the effective level (e.g., high level), the fourth transistor M4 is turned on, in this way, the second node Q2 and the first voltage terminal VDD are electrically connected, and further both the first electrode and the second electrode of the nineteenth transistor are at high levels to avoid electrical leakage from the first node Q1.

For example, the output circuit 400 may be implemented as the fifth transistor M5, the sixth transistor M6, and the first capacitor C1. The gate of the fifth transistor M5 is connected to the first node Q1, the first electrode of the fifth transistor M5 is connected to the first clock signal terminal CLKD to receive the first clock signal as an output signal, and the second electrode of the fifth transistor M5 is connected to the shift output terminal CR<N>. The gate of the sixth transistor M6 is connected to the first node Q1, the first electrode of the sixth transistor M6 is connected to the first clock signal terminal CLKD to receive the first clock signal as an output signal, and the second electrode of the sixth transistor M6 is connected to the scan signal output terminal OUT1<N>. The first terminal of the first capacitor C1 is connected to the first node Q1, and the second terminal of the first capacitor C1 is connected to the shift output terminal CR<N>. Please note that the suffix "<N>" here indicates the n-th level shift register unit (N is an integer greater than 0) in the gate drive circuit, which will be described in detail later. It should be noted that the shift register unit may also include more output signals and scanning signal outputs corresponding to the output signals.

The blocking circuit 500 may be implemented as the seventh transistor M7. The gate of the seventh transistor M7 is connected to the third node Q3 (the connection line corresponding to this connection is omitted in the figure), the first electrode of the seventh transistor M7 is connected to the second node Q2, and the second electrode of the seventh transistor M7 is connected to the second voltage terminal VGL1 to receive the second voltage. For example, when the third node Q3 is at an effective level (e.g., high level), the seventh transistor M7 is turned on, so that the second node Q2 is connected to the second voltage terminal VGL1, thereby writing the second voltage to the second node Q2. At this time, the second transistor M2 is also turned on in response to the high level of the third node. If the display reset signal is also at the high level, the third transistor M3 is turned on accordingly, thereby writing the low level of the second node Q2 into the first node Q1 and thus realizing reset. When the third node Q3 is at an non-operating level (e.g., low level), the seventh transistor M7 is turned off, and at the same time, the first node Q1 is at a high level, so that the fourth transistor M4 is turned on, so that the second node Q2 is at a high level. Because the seventh transistor M7 is turned off, the high level of the second node Q2 can be maintained, thereby realizing the anti-leakage function.

The first control circuit 600 may be implemented as the eighth transistor M8, the ninth transistor M9, and the tenth transistor M10. The gate of the eighth transistor M8 is connected to the first electrode thereof, and is configured to be connected to the third voltage terminal VDD_A to receive the third voltage, and the second electrode of the eighth transistor M8 is connected to the third node Q3. The gate of the ninth transistor M9 is connected to the first electrode and is configured to be connected to the fourth voltage terminal VDD_B to receive the fourth voltage, and the second electrode of the ninth transistor M9 is connected to the third node Q3. The gate of the tenth transistor M10 is connected to the first node Q1, the first electrode of the tenth transistor M10 is connected to the third node Q3, and the second electrode of the tenth transistor M10 is connected to the second voltage terminal VGL1 to receive the second voltage.

When the eighth transistor M8 or the ninth transistor M9 is turned on, the third voltage or the fourth voltage can charge the third node Q3, thereby pulling the potential of the third node Q3 up to a high level. When the potential of the first node Q1 is at a high level, the tenth transistor M10 is turned on. For example, when the channel aspect ratio of a transistor is designed, the tenth transistor M10 and the eighth transistor M8 (or the ninth transistor M9) can be designed such that when both the tenth transistor M10 and the eighth transistor M8 (or the ninth transistor M9) are turned on, the level of the third node Q3 can be pulled down to a low level, which can keep the seventh transistor M7, the second transistor M2, the thirteenth transistor M13, and the fourteenth transistor M14 being turned off.

The second control circuit 700 may be implemented as the eleventh transistor M11. The gate of the eleventh transistor M11 is connected to the second clock signal terminal CLKA to receive the second clock signal, the first electrode of the eleventh transistor M11 is connected to the third node Q3, and the second electrode of the eleventh transistor M11 is connected to the second voltage terminal VGL1 to receive the second voltage. For example, when the second clock signal is at a high level, the eleventh transistor M11 is turned on, so that the third node Q3 can be pulled down by the second voltage terminal VGL1. In the blanking period of one frame, the influence of the third node Q3 on the level of the first node Q1 can be reduced in this way, so that the second input circuit 120 charges the first node Q1 more sufficiently.

The third control circuit 800 may be implemented as the twelfth transistor M12. The gate of the twelfth transistor M12 is connected to the display control terminal STU1 to receive a first control signal, the first electrode of the twelfth transistor M12 is connected to the third node Q3, and the second electrode of the twelfth transistor M12 is connected to the second voltage terminal VGL1 to receive a second voltage. For example, when the first control signal is at a high level, the twelfth transistor M12 is turned on, so that the third node Q3 can be pulled down by the second voltage terminal VGL1. For example, when the shift register units 10 shown in FIG. 7 are cascaded to form a gate drive circuit, the display control terminal STU1 of the (n+2)th stage shift register unit 10 may be electrically connected to the (n+1)th stage (n is an integer greater than 0) or the shift output terminal CR of the n-th stage shift register unit 10. In this way, the influence of the third node Q3 on the first node Q1 can be reduced in the display period of one frame, so that the first input circuit 110 charges the first node Q1 more sufficiently.

For example, at least one scan signal output includes one scan signal output, for example, the first scan signal output terminal OUT1<N>, the output noise reduction circuit 900 may be implemented as the thirteenth transistor M13 and the fourteenth transistor M14. The gate of the thirteenth transistor M13 is connected to the third node Q3, the first electrode of the thirteenth transistor M13 is connected to the shift output terminal CR<N>, and the second electrode of the thirteenth transistor M13 is connected to the second voltage terminal VGL1 to receive the second voltage. The gate of the fourteenth transistor M14 is connected to the third node Q3, the first electrode of the fourteenth transistor M14 is connected to the first scan signal output terminal OUT1<N>, and the second electrode of the fourteenth transistor M14 is connected to the fifth voltage terminal VGL2 to receive the fifth voltage.

For example, when the third node Q3 is at an effective level (e.g., high level), both the thirteenth transistor M13 and the fourteenth transistor M14 are turned on, so that the shift output terminal CR<N> is electrically connected to the second voltage terminal VGL1, and the first scan signal output terminal OUT1<N> is electrically connected to the fifth voltage terminal VGL2, thereby reducing noise to the shift output terminal CR<N> and the first scan signal output terminal OUT1<N>.

For example, the fifth voltage terminal VGL2 is configured to provide a DC low-level signal (e.g., lower than or equal to the low-level portion of the clock signal), such as is grounded, and the DC low-level signal is referred to as the fifth voltage; the following embodiments are the same as the above and will not be described again. For example, in one example, the fifth voltage of the fifth voltage terminal VGL2 is higher than the second voltage of the second voltage terminal VGL1; in another example, the fifth voltage of the fifth voltage terminal VGL2 is equal to the second voltage of the second voltage terminal VGL1. The fifth voltage and the second voltage may be the same or different, depending on actual requirements.

It should be noted that in various embodiments of the present disclosure, when more shift output terminals and more scan signal output terminals are respectively included, the output noise reduction circuit 900 correspondingly includes a plurality of transistors corresponding to the shift output terminals and/or the scan signal output terminals to reduce noise.

The charging circuit 121 may be implemented as the fifteenth transistor M15. For example, the gate of the fifteenth transistor M15 is connected to the third clock signal terminal CLKB to receive the third clock signal, the first electrode of the fifteenth transistor M15 is connected to the blanking control terminal STU2 to receive the second control signal, and the second electrode of the fifteenth transistor M15 is connected to the blanking node H. When the third clock signal is at an effective level (e.g., high level), the fifteenth transistor M15 is turned on to electrically connect the blanking control terminal STU2 to the blanking node H, thereby writing the second control signal to the upper blanking node H. For example, when the second control signal is high, the blanking node H is charged.

The storage sub-circuit 122 may be implemented as the second capacitor C2. The first electrode of the second capacitor C2 is configured to be connected to the blanking node H, and the second electrode of the second capacitor C2 is configured to be connected to the second voltage terminal VGL1 to receive the second voltage. When the high level of the second control signal is written to the blanking node H, the blanking node H is charged to the high level, and the second capacitor C2 stores the high level and maintains the blanking node H at the high level for use at a subsequent stage.

Figure 8B:
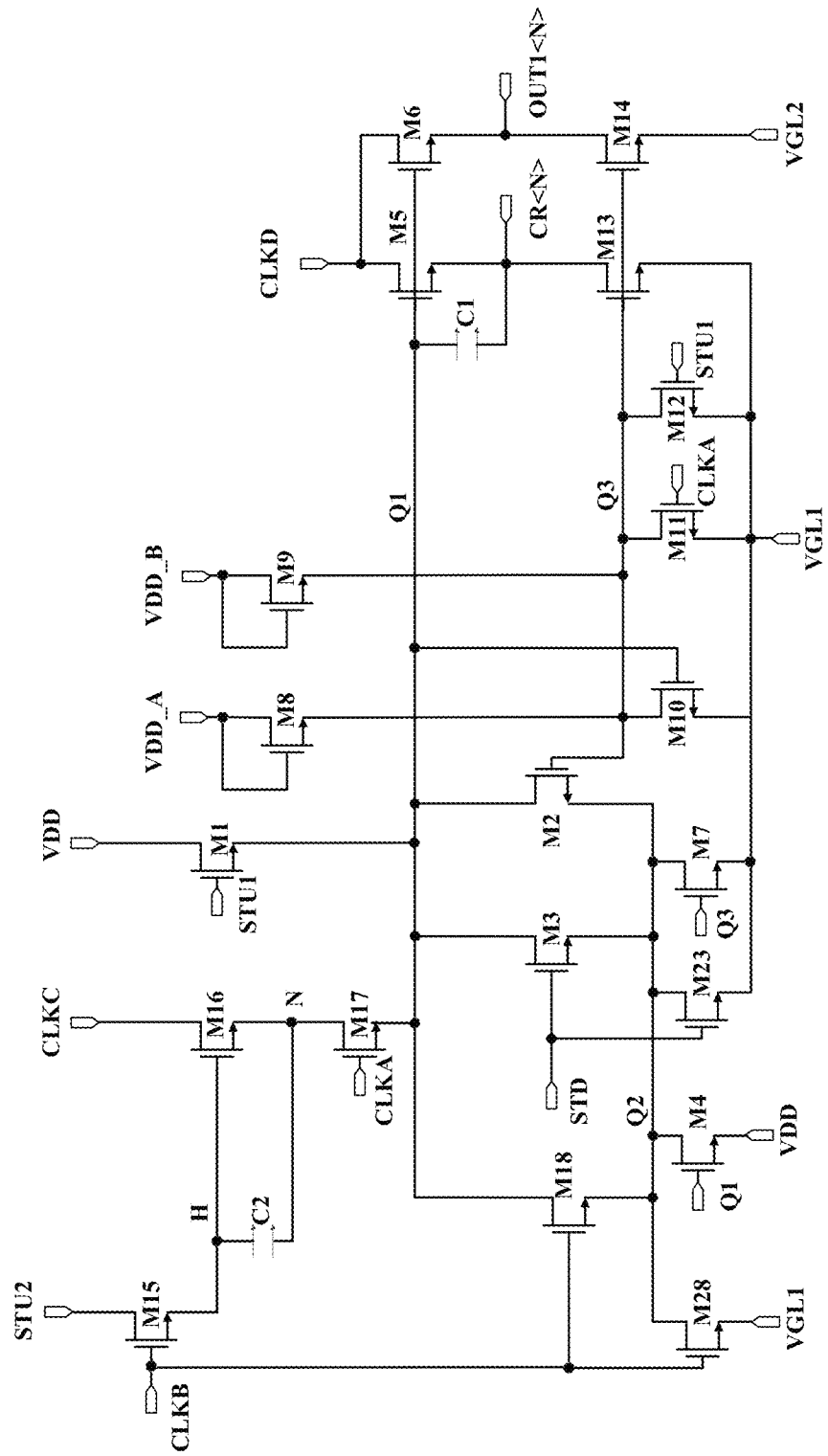
FIG. 8B is a circuit diagram of still another specific implementation example of the shift register unit shown in FIG. 5.
Figure 8C:
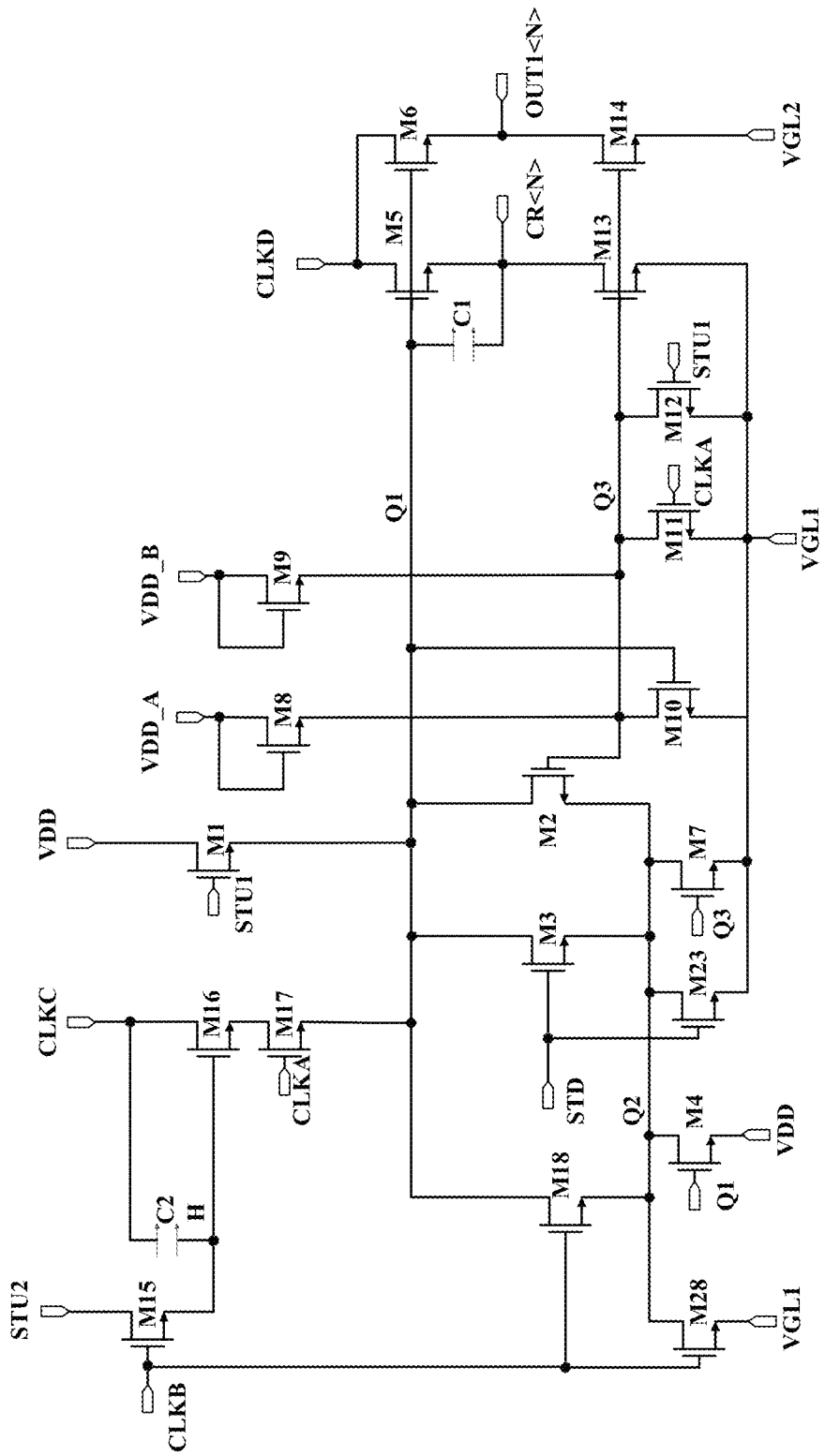
FIG. 8C is a circuit diagram of further another specific implementation example of the shift register unit shown in FIG. 5.

It should be noted that in various embodiments of the present disclosure, the second capacitor C2 may be a capacitor manufactured by a process, for example, a special capacitor electrode is manufactured to realize the capacitor, each electrode of the capacitor may be realized by a metal layer, a semiconductor layer (e.g., doped poly-silicon), etc., and the second capacitor C2 may also be a parasitic capacitor between various devices, and may be realized by the transistor itself and other device or circuit. The connection mode of the second capacitor C2 is not limited to the above-described mode, but may be other suitable connection modes as long as the level written to the blanking node H can be stored. For example, in another example, as shown in FIG. 8B, the first electrode of the second capacitor C2 is connected to the blanking node H, and the second electrode is connected to a certain position in the isolation sub-circuit 123 (e.g., the connection point N between the second electrode of the sixteenth transistor M16 and the first electrode of the seventeenth transistor M17 described below); alternatively, in another example, as shown in FIG. 8C, the first electrode of the second capacitor C2 is connected to the blanking node H, and the second electrode is connected to one end of the isolation sub-circuit 123 (e.g., the fourth clock signal terminal CLKC described below).

The isolation sub-circuit 123 may be implemented as the sixteenth transistor M16 and the seventeenth transistor M17. For example, the gate of the sixteenth transistor M16 is connected to the blanking node H, the first electrode of the sixteenth transistor M16 is connected to the fourth clock signal terminal CLKC to receive the fourth clock signal as the second input signal, the second electrode of the sixteenth transistor M16 is connected to the first electrode of the seventeenth transistor M17, the gate of the seventeenth transistor M17 is connected to the second clock signal terminal CLKA to receive the second clock signal, and the second electrode of the seventeenth transistor M17 is connected to the first node Q1. When the blanking node H is at a high level and the second clock signal is also at a high level, both the sixteenth transistor M16 and the seventeenth transistor M17 are turned on to electrically connect the fourth clock signal terminal CLKC with the first node Q1, thereby writing the fourth clock signal to the first node Q1 and pulling up the potential of the first node Q1 to the operating potential.

The second reset circuit 220 may be implemented as the eighteenth transistor M18 and a twenty-eighth transistor M28. For example, the gate of the eighteenth transistor M18 is connected to the third clock signal terminal CLKB (i.e., the blanking reset signal terminal RE1) to receive the third clock signal as the blanking reset signal, the first electrode of the eighteenth transistor M18 is connected to the first node Q1, and the second electrode of the eighteenth transistor M18 is connected to the second node Q2. The gate of the twenty-eighth transistor M28 is connected to the third clock signal terminal CLKB to receive the third clock signal, the first electrode of the twenty-eighth transistor M28 is connected to the second node Q2, and the second electrode of the twenty-eighth transistor M28 is connected to the second voltage terminal VGL1 to receive the second voltage. For example, in the blanking period of one frame, when the third clock signal is at an effective level (e.g., high level), the eighteenth transistor M18 is turned on, electrically connecting both the first node Q1 and the second node Q2 (at this time, low level) with the second voltage terminal VGL1, thereby resetting the first node Q1. For example, the second reset circuit 220 may include only the eighteenth transistor M18. At this time, by adjusting the timing of the second clock signal and the fourth clock signal, for example, the second clock signal is at a high level and the fourth clock signal is at a low level, the first node Q1 may be reset by the sixteenth transistor M16 and the seventeenth transistor M17 in the reset phase, thereby reducing the number of transistors and reducing the cost.

In the embodiments of the present disclosure, for example, when each circuit is implemented as an N-type transistor, the term "pull-up" means charging a node or an electrode of a transistor so as to raise the absolute value of the level of the node or the electrode, thereby realizing the operation (e.g., turning-on) of the corresponding transistor; "pull-down" refers to discharging a node or an electrode of a transistor so that the absolute value of the level of the node or the electrode decreases, thereby realizing the operation (e.g., turning-off) of the corresponding transistor.

For another example, when each circuit is implemented as a P-type transistor, the term "pull-up" means discharging a node or an electrode of a transistor so that the absolute value of the level of the node or the electrode decreases, thereby realizing the operation (e.g., turning-on) of the corresponding transistor; "pull-down" means to charge a node or an electrode of a transistor so that the absolute value of the level of the node or the electrode increases, thereby realizing the operation (e.g., turning-off) of the corresponding transistor.

It should be noted that in the description of various embodiments of the present disclosure, the first node Q1, the second node Q2, the third node Q3, the blanking node H, and the connection point N do not necessarily represent actual components, but represent the junction points of related electrical connections in the circuit diagram.

It should be noted that the transistors used in the embodiments of the present disclosure can be thin film transistors, field effect transistors or other switching devices with the same characteristics, and the embodiments of the present disclosure are all described with thin film transistors as examples. The source and drain of a transistor used here can be symmetrical in structure, so the source and drain can be structurally indistinguishable. In the embodiment of the present disclosure, in order to distinguish the two electrodes of the transistor except the gate, one electrode is directly described as the first electrode and the other electrode is described as the second electrode.

In addition, the transistors in the embodiments of the present disclosure are all described by taking N-type transistors as example, in which the first electrode of the transistor is a drain electrode and the second electrode is a source electrode. It should be noted that this disclosure includes but is not limited to this case. For example, one or more transistors in the shift register unit 10 provided by the embodiment of the present disclosure may also adopt P-type transistors; in this case, the first electrode of the transistor is the source electrode and the second electrode is the drain electrode; all that is required is to connect the electrodes of the selected type of transistors with reference to the respective electrodes of the respective transistors in the embodiments of the present disclosure and to make the respective voltage terminals provide a high voltage or a low voltage correspondingly. When an N-type transistor is used, Indium Gallium Zinc Oxide (IGZO) can be used as the active layer of the thin film transistor. Compared with low temperature poly silicon (LTPS) or amorphous silicon (such as hydrogenated amorphous silicon) being used as the active layer of the thin film transistor, the size of the transistor can be effectively reduced and leakage current can be prevented.

Figure 9:
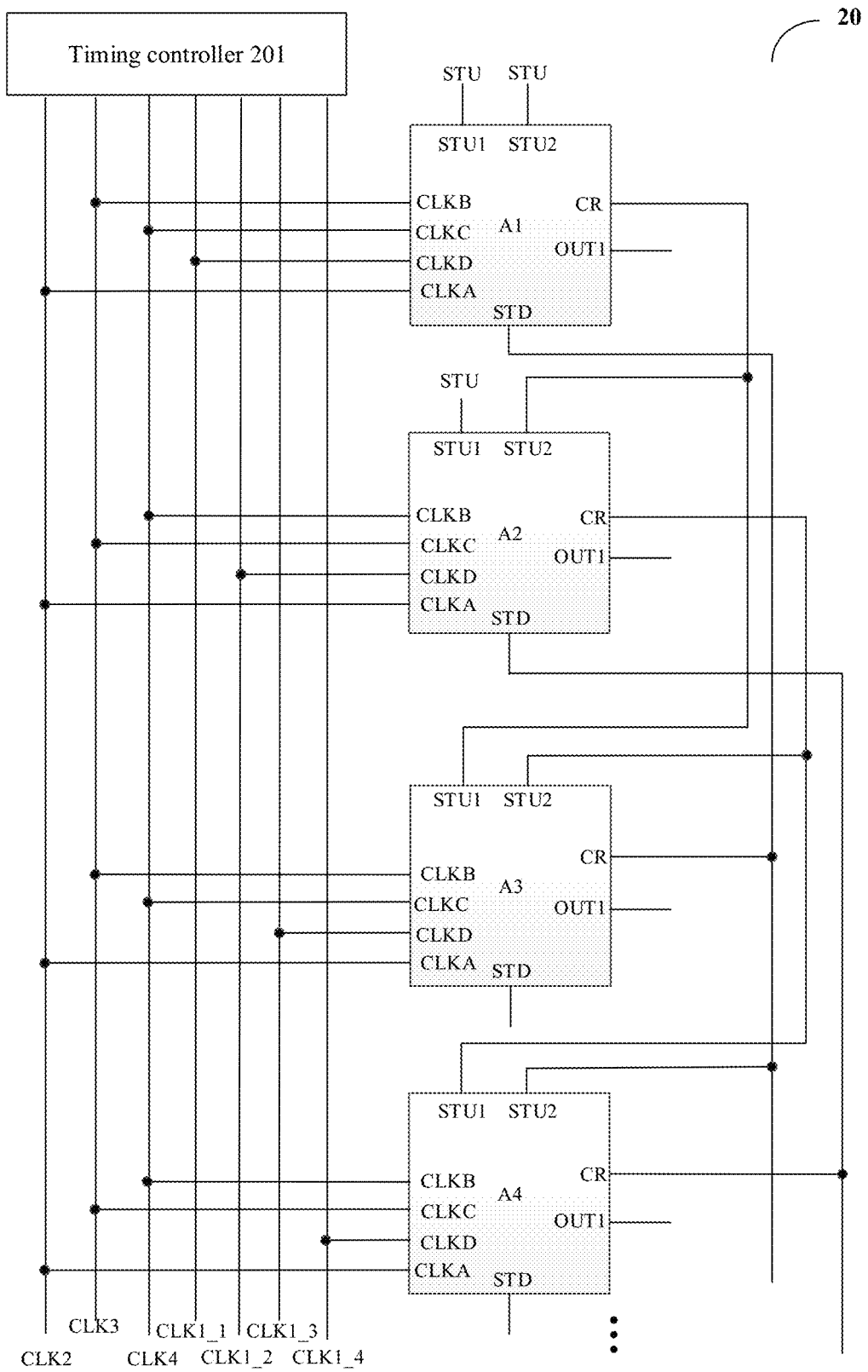
FIG. 9 is a schematic diagram of a gate drive circuit according to at least an embodiment of the present disclosure.

An embodiment of the present disclosure provides a gate drive circuit 20. As shown in FIG. 9, the gate drive circuit 20 includes a plurality of cascaded shift register units 10, any one or more of the shift register units 10 may adopt the structure of the shift register unit 10 provided by the embodiments of the present disclosure or a variation thereof. It should be noted that only the first four-stage shift register units (A1, A2, A3 and A4) of the gate drive circuit 20 are schematically shown in FIG. 9. For example, the gate drive circuit 20 can be directly integrated on the array substrate of the display device by using the same semiconductor process as the thin film transistor to realize progressive or interlaced scanning driving function.

As shown in FIG. 9, the gate drive circuit 20 further includes four sub-clock signal lines CLK1_1-CLK1_4 respectively connected to the first clock signal terminals CLKD of the respective stages. In the case where the shift register unit includes the first clock signal terminal CLKD, the first clock signal terminal CLKD of the (4n−3)th (n is an integer greater than 0) stage shift register unit is connected to the first sub-clock signal line CLK1_1; the first clock signal terminal CLKD and the second sub-clock signal line of the (4n−2)th stage shift register unit are connected to CLK1_2; the first clock signal terminal CLKD of the (4n−1)th stage shift register unit is connected to the third sub-clock signal line CLK1_3; the first clock signal terminal CLKD of the (4n)th stage shift register unit is connected to the fourth sub-clock signal line CLK1_4. It should be noted that in different examples, more sub-clock signal lines can be provided for the gate drive circuit according to different configurations. For example, the gate drive circuit may include six, eight, or ten sub-clock signal lines, etc.

As shown in FIG. 9, the gate drive circuit 20 may further include a third clock signal line CLK3 and a fourth clock signal line CLK4. In the case where the shift register unit includes the third clock signal terminal CLKB and the fourth clock signal terminal CLKC, the third clock signal terminal CLKB of the (2n−1)th stage shift register unit is connected to the third clock signal line CLK3, and the fourth clock signal terminal CLKC is connected to the fourth clock signal line CLK4; the third clock signal terminal CLKB of the (2n)th stage shift register unit is connected to the fourth clock signal line CLK4, and the fourth clock signal terminal CLKC is connected to the third clock signal line CLK3.

As shown in FIG. 9, the gate drive circuit 20 may further include a second clock signal line CLK2, and the second clock signal terminal CLKA of each shift register unit stage is connected to the second clock signal line CLK2.

As shown in FIG. 9, each shift register unit includes a display control terminal STU1, a blanking control terminal STU2, first to fourth clock signal terminals CLKA-CLKD, a display reset terminal STD, a shift output terminal CR, a first scan signal output terminal OUT1, etc.

The display control terminal STU1 and the blanking control terminal STU2 of the first stage shift register unit as well as the display control terminal STU1 of the second stage shift register unit are all connected to the trigger signal line STU, for example, receiving the trigger signal STV. For example, except for the first-stage shift register unit, the blanking control terminal STU2 of the (n+1)th stage shift register unit is connected to the shift output terminal CR of the n-th stage shift register unit. For example, except for the first stage shift register unit and the second stage shift register unit, the display control terminal STU1 of the (n+2)th stage shift register unit is connected to the shift output terminal CR of the n-th stage shift register unit. For example, except for the last two stages of shift register units, the display reset terminal STD of each stage of shift register units is connected to the shift output terminal CR of the shift register unit separated from this stage by one stage. For example, the display reset terminal of the last two-stage shift register unit is connected to a reset line (not shown) to receive a reset signal.

For example, the gate drive circuit 20 may further include a timing controller 201 configured to provide the above-mentioned respective clock signals to shift register units of the respective stages, for example, and the timing controller 201 may also be configured to provide a trigger signal and a reset signal. It should be noted that the phase relationship among the clock signals provided by the timing controller 201 can be determined according to actual requirements.

For example, the gate drive circuit 20 further includes a plurality of voltage lines to provide a plurality of voltage signals to shift register units of the respective stages, including, for example, relatively high-level signals VDD, VDD_A, VDD_B, and low-level signals VGL1, VGL2, etc.

For example, when the gate drive circuit 20 is used to drive a display panel, the gate drive circuit 20 may be disposed on one side of the display panel. For example, the display panel includes a plurality of rows of gate lines, and the first scan signal output terminals OUT1 of all the shift register units in the gate drive circuit 20 may be configured to be sequentially connected to the plurality of rows of gate lines for outputting drive signals. Of course, the gate drive circuits 20 may also be provided on both sides of the display panel to realize double-sided driving. The embodiments of the present disclosure do not limit the arrangement of the gate drive circuits 20. For example, the gate drive circuit 20 may be provided on one side of the display panel for driving odd row gate lines, while another gate drive circuit 20 may be provided on the other side of the display panel for driving even row gate lines.

Figure 10:
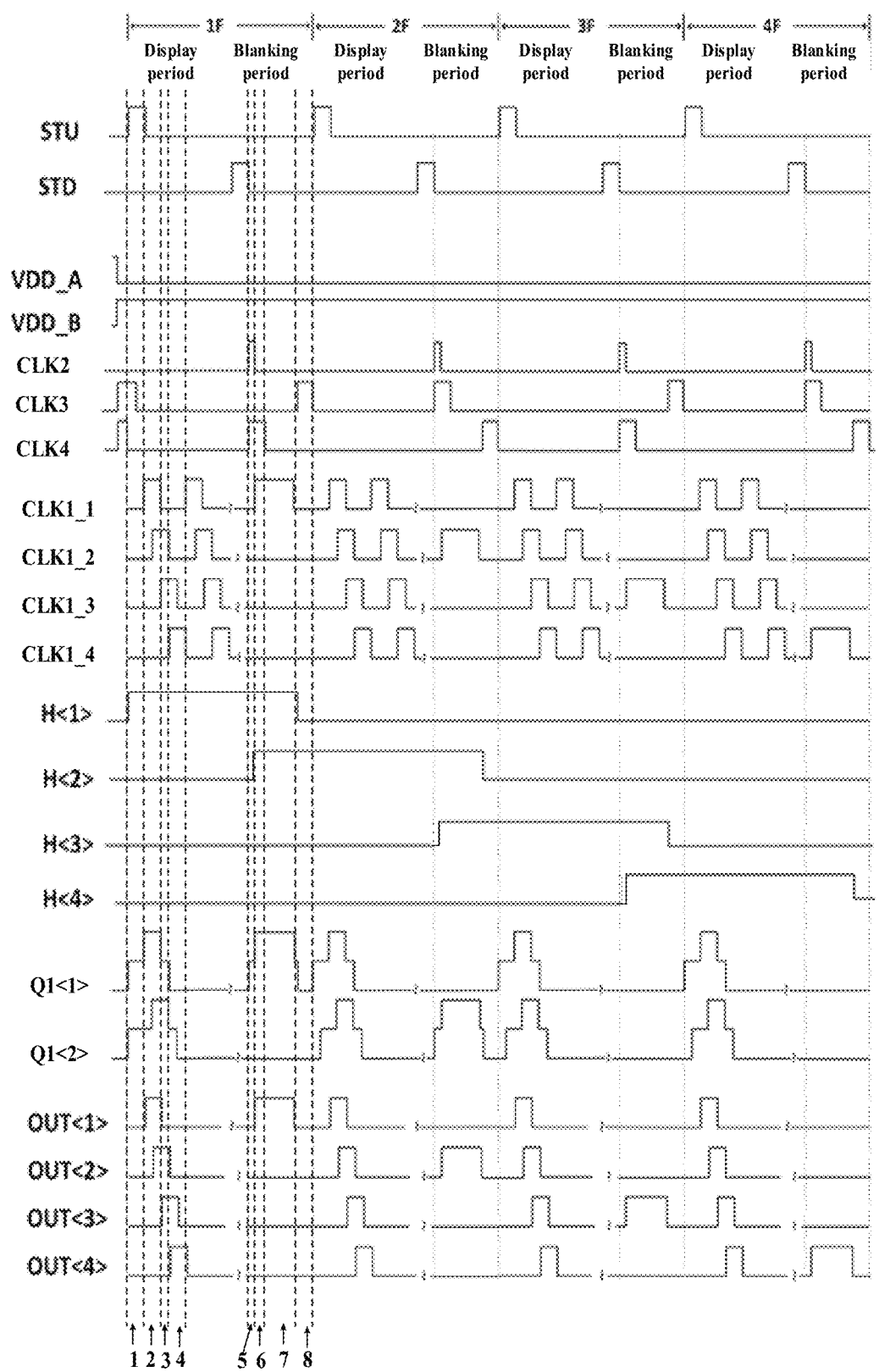
FIG. 10 is a signal timing diagram corresponding to the operation of the gate drive circuit shown in FIG. 9 according to at least an embodiment of the present disclosure.

FIG. 10 is a signal timing diagram of a gate drive circuit according to an embodiment of the present disclosure. For example, the timing of the clock signals provided by all of the clock signal lines CLK1_1-CLK1_4 and CLK2-CLK4 of the gate drive circuit shown in FIG. 9 may adopt the signal timing shown in FIG. 10 to realize the function of the gate drive circuit 20 to output a gate scan signal line by line.

In FIG. 10, Q1<1> and Q1<2> respectively represent the first nodes Q1 in the first stage and the second stage of shift register units in the gate drive circuit 20. Similarly, the suffix "<N>" indicates the n-th stage shift register unit in the gate drive circuit 20, and correspondingly OUT1<1>, OUT1<2>, OUT1<3> and OUT1<4> respectively indicate the first scan signal output terminals OUT1 in the first, second, third and fourth stages of shift register units in the gate drive circuit 20. 1F, 2F, 3F, and 4F represent the first frame, the second frame, the third frame, and the fourth frame of picture, respectively. It should be noted that, for clarity and conciseness, because the potential of the shift output terminal CR and the potential of the first scan signal output terminal OUT1 in each stage of the shift register unit are the same, they are not shown in FIG. 10.

It should be noted that the signal level in the signal timing diagram shown in FIG. 10 is only schematic and does not represent the true level value.

The operation principle of the gate drive circuit 20 shown in FIG. 9 will be described below with reference to the signal timing chart shown in FIG. 10.

The third clock signal terminal CLKB of the shift register unit 10 of an odd row is connected to the third clock signal line CLK3, and the third clock signal terminal CLKB of the shift register unit 10 of an even row is connected to the fourth clock signal line CLK4. Referring to FIG. 10, the third clock signal line CLK3 and the fourth clock signal line CLK4 are alternately at high levels at the end portion of the blanking period of each frame, thereby alternately inputting high levels to the third clock signal terminal CLKB of the shift register units 10 of odd and even rows to alternately reset the blanking node H and the first node Q1 of the shift register units 10 of odd and even rows. When the third clock signal terminal CLKB of the n-th row shift register unit 10 is at a high level, the fourth clock signal terminal CLKC of the (n+1)th row shift register unit 10 is at a high level; at this time, the second clock signal terminal CLKA is at a low level, turning off the seventeenth transistor M17, so that the level of the first node Q1 of the N+1st row shift register unit 10 does not become at a high level due to the high level of the fourth clock signal terminal CLKC, thereby avoiding output abnormality.

In the display period of the first frame 1F, the operation process of the shift register unit A1 of the first stage is described as follows.

In the first stage 1, the display control terminal STU1 and the blanking control terminal STU2 of the first stage shift register unit A1 are both connected to the trigger signal line STU, so both the display control terminal STU1 and the blanking control terminal STU2 are input with a high level at the beginning, and at the same time, because the third clock signal terminal CLKB (connected to the third clock signal line CLK3) is input with a high level, the fifteenth transistor M15 is turned on, and the blanking node H is charged to a high level and stored by the second capacitor C2. The twelfth transistor M12 is turned on due to the high level of the first control signal provided by the display control terminal STU1, so that the auxiliary pull-down operation can be performed to the third node Q3.

Next, the third clock signal terminal CLKB inputs a low level, the fifteenth transistor M15 is turned off, the display control terminal STU1 continues to input a high level, and the first transistor M1 is turned on due to the high level input by the display control terminal STU1, so that the high level signal of the first voltage terminal VDD can continue to charge the first node Q1 through the first transistor M1, so that the first node Q1 is pulled up to a high level and stored by the first capacitor C1.

At this stage, the fifth transistor M5 and the sixth transistor M6 are turned on under the control of the level of the first node Q1, but because the first clock signal terminal CLKD (connected to the first sub-clock signal line CLK1_1) inputs a low-level signal at this time, both the shift output terminal CR and the first scan signal output terminal OUT1<1> output a low-level signal.

In the second stage 2, a high level signal is input by the first clock signal terminal CLKD, and the potential of the first node Q1 is further pulled high due to the bootstrap effect, so the fifth transistor M5 and the sixth transistor M6 remain to be turned on, and thus both the shift output terminal CR and the first scan signal output terminal OUT1<1> output high level signals. For example, the high-level signal output from the shift output terminal CR can be used for scanning shift for the previous and following stage of shift register units, while the high-level signal output from the first scan signal output terminal OUT1<1> can be used to drive sub-pixel units in the display panel for display.

Meanwhile, the fourth transistor M4 is turned on in response to the high level of the first node Q1, so that the second node Q2 is pulled up to a first voltage (e.g., high level), so that the voltage difference across the first reset circuit 210 and the second reset circuit 220 is reduced, thereby preventing the high level of the first node Q1 from leaking through the first reset circuit 210 and the second reset circuit 220.

In the third stage 3, a low level signal is input by the first clock signal terminal CLKD, and both the shift output terminal CR and the first scan signal output terminal OUT1<1> can be discharged through the first clock signal terminal CLKD, thus completing the reset of the shift output terminal CR and the first scan signal output terminal OUT1<1>. Because the shift output terminal CR and the first scan signal output terminal OUT1<1> are reset to the low level, the potential of the first node Q1 will drop by an amplitude due to the coupling effect between the transistors.

Meanwhile, because the display reset terminal STD of the first-stage shift register unit is connected to the shift output terminal CR of the fourth-stage shift register unit, while the shift output terminal CR of the fourth-stage shift register unit has not yet output a high-level signal, the first node Q1 will not be pulled down, so that the first node Q1 can be kept at a higher level.

In the fourth stage 4, the shift output terminal CR of the fourth stage shift register unit A4 outputs a high level, so that the display reset terminal STD of the first stage shift register unit A1 is input by the high level signal, and the third transistor M3 and the twenty-third transistor M23 are turned on, so that the first node Q1 and the second node Q2 are pulled down to a low level, completing the reset of the first node Q1 and the second node Q2. At this time, the tenth transistor M10 is turned off in response to the level of the first node Q1. Because the ninth transistor M9 is turned on, the third node Q3 is pulled up to the high level, and the second transistor M2 is turned on under the control of the level of the third node Q3, thereby further reducing noise of the first node Q1.

Through the above process, the potential change of the first node Q1 of the first-stage shift register unit A1 presents a tower-like shape. The pull-up and reset of the output signal of the shift output terminal CR are both realized by the fifth transistor M5, the pull-up and reset of the output signal of the first scan signal output terminal OUT1 are both realized by the sixth transistor M6, and the thirteenth transistor M13 and the fourteenth transistor M14 play an auxiliary pull-down role on the output signals of the shift output terminal CR and the first scan signal output terminal OUT1<1>, so that the volume/size of the thirteenth transistor M13 and the fourteenth transistor M14 can be reduced, which is beneficial to reducing the area of the circuit layout.

In the display period of the above-mentioned first frame, since the second clock signal terminal CLKA is kept at a low level, the seventeenth transistor M17 is kept in a turning-off state, and the seventeenth transistor M17 isolates the influence of the high level stored at the blanking node H on the display period (for example, the influence on the level of the first node Q1).

After the first-level shift register unit A1 drives the sub-pixels of the first row in the display panel to complete the display, and in a similar way, the shift register units of the second-level, the third-level, and so on drive the sub-pixel units of the display panel row by row to complete the display drive of one frame. At this point, the display period of the first frame ends.

In the blanking period of the first frame 1F, the operation process of the shift register unit A1 of the first stage is described as follows.

In the fifth stage 5, the blanking node H maintains the high level of the display period due to the storage of the second capacitor C2. At the beginning, the second clock signal terminal CLKA and the fourth clock signal terminal CLKC input high level signals, and the sixteenth transistor M16 and the seventeenth transistor M17 are turned on, so that the high level of the fourth clock signal terminal CLKC can charge the first node Q1 and pull up the first node Q1 to a high potential. The tenth transistor M10 is turned on under the control of the first node Q1, the third node Q3 is pulled down to a low level, and the eleventh transistor M11 is also turned on under the control of the second clock signal terminal CLKA, so that the third node Q3 can be further pulled down.

In the sixth stage 6, a low level signal is input to the second clock signal terminal CLKA, and the seventeenth transistor M17 is turned off. The first clock signal terminal CLKD (connected to the first sub-clock signal line CLK1_1) inputs a high level signal, the potential of the first node Q1 is further pulled high due to the bootstrap effect, the fifth transistor M5 and the sixth transistor M6 are turned on, and the high level signal input by the first clock signal terminal CLKD can be output to the shift output terminal CR and the first scan signal output terminal OUT1<N>. For example, the signal output from the first scanning signal output terminal OUT1<1> can be used to drive the sensing transistor for compensation in the sub-pixel unit of the display panel to realize external compensation.

Meanwhile, the fourth transistor M4 is turned on in response to the high level of the first node Q1, so that the second node Q2 is pulled up to a first voltage (e.g., high level), so that the voltage difference across the first reset circuit 210 and the second reset circuit 220 is reduced, thereby preventing the high level of the first node Q1 from leaking through the first reset circuit 210 and the second reset circuit 220.

Meanwhile, since the third clock signal terminal CLKB of the second-stage shift register unit A2 is connected to the fourth clock signal line CLK4, and the blanking control terminal STU2 of the second-stage shift register unit A2 is connected to the shift output terminal CR of the first-stage shift register unit A1, the fifteenth transistor M15 in the second-stage shift register unit is turned on, thus causing the blanking node H<2> in the second-stage shift register unit A2 to be pulled up to a high level.

In the seventh stage 7, when the blanking node H<2> in the second stage shift register unit A2 is sufficiently written to the high potential, the fourth clock signal line CLK4 inputs a low level signal. At the same time, the first clock signal terminal CLKD continuously inputs a high level, and the first node Q1 is still at a high level, so the shift output terminal CR and the first scan signal output terminal OUT1<N> of the first stage shift register unit A1 keep outputting high level signals. During this process, the seventeenth transistor M17 is always kept in the turning-off state, so electrical leakage from the first node Q1<1> through the seventeenth transistor M17 can be prevented. Meanwhile, the fourth transistor M4 is turned on in response to the high level of the first node Q1, so that the second node Q2 is pulled up to a first voltage (e.g., high level), so that the voltage difference across the first reset circuit 210 and the second reset circuit 220 is reduced, thereby preventing the high level of the first node Q1 from leaking through the first reset circuit 210 and the second reset circuit 220.

In the eighth stage 8, that is, in the final stage of the blanking period, the third clock signal line CLK3 inputs a high-level signal, which can turn on the eighteenth transistor M18 and the twenty-eighth transistor M28. Because the third clock signal end CLKB of the shift register unit of an odd-numbered stage is connected to the third clock signal line CLK3, reset of the blanking node H and the first node Q1 in the shift register units of all the odd-numbered stages can be completed, especially reset of the first nodes Q1 and the second nodes Q2 of the first stage and the third stage, and reset of the blanking node H of the first stage. Because the threshold voltage of the transistor(s) may drift when a positive voltage is applied thereto, the blanking node H needs to be kept at the positive voltage for a short period of time by adopting the above-mentioned method, thereby reducing the time when the threshold voltage of the transistor drifts and improving the reliability of the transistor(s). It should be noted that at this stage, the levels of the second clock signal line and the fourth clock signal line can also be adjusted; for example, the second clock signal line is at a high level and the fourth clock signal line is at a low level, so that the sixteenth transistor M16 and the eighteenth transistor M18 are turned on, thereby resetting the first node through the sixteenth transistor M16 and the eighteenth transistor M18.

At this point, the driving timing of the first frame ends.

In the display period of the second frame, the gate drive circuit 20 repeats the same operation as the display period of the first frame, and will not be repeated here.

In the blanking period of the second frame, for the shift register unit of the second stage, the fourth clock signal terminal CLKC is connected to the third clock signal line CLK3, thus at the beginning of the blanking period, the second clock signal terminal CLKA and the fourth clock signal terminal CLKC of the shift register unit of the second stage input high-level signals, the sixteenth transistor M16 and the seventeenth transistor M17 are turned on, so that the high level input by the fourth clock signal terminal CLKC can charge the first node Q1 and pull up the first node Q1 to a high potential. Then, when a high-level signal is input to the second sub-clock signal line CLK1_2, the shift output terminal CR and the first scan signal output terminal OUT1<N> output a high-level signal while charging the blanking node H in the shift register unit A3 of the third stage. Meanwhile, the fourth transistor M4 is turned on in response to the high level of the first node Q1, so that the second node Q2 is pulled up to a first voltage (e.g., high level), so that the voltage difference across the first reset circuit 210 and the second reset circuit 220 is reduced, thereby preventing the high level of the first node Q1 from leaking through the first reset circuit 210 and the second reset circuit 220. In the last stage of the blanking period of the second frame, the fourth clock signal line CLK4 inputs a high-level signal. Because the third clock signal terminal CLKB of the shift register units of the even stage are all connected to the fourth clock signal line CLK4, reset of the blanking node H, the first node Q1 and the second node Q2 in all the shift register units of the even stages can be completed.

At this point, the driving timing of the second frame ends. Subsequent driving of the gate drive circuit in more frames such as the third frame, the fourth frame, the fifth frame, etc. can refer to the above description and will not be repeated here.

As described above, in the blanking period of each frame, the gate drive circuit outputs a driving signal for the sensing transistors in the sub-pixel units in the display panel, and the driving signal is sequentially supplied row by row. For example, in the blanking period of the first frame, the gate drive circuit outputs a drive signal for the first row of sub-pixel units of the display panel, and in the blanking period of the second frame, the gate drive circuit outputs a drive signal for the second row of sub-pixel units of the display panel, and in the same way, to complete row-by-row sequential compensation.

As shown in FIG. 10, the waveforms of the first sub-clock signal line CLK1_1, the second sub-clock signal line CLK1_2, the third sub-clock signal line CLK1_3, and the fourth sub-clock signal line CLK1_4 sequentially overlap 50% of the effective pulse width in the display period of one frame, and the waveforms in the blanking period of each frame are sequentially shifted. The waveforms of the output signals of the first scan signal output terminals OUT1 of the first to fourth shift register units A1-A4 in the display period of one frame overlap 50% of the effective pulse width in sequence, and the waveforms in the blanking period of each frame shift in sequence. The output signals of the gate drive circuit 20 overlap during the display period, so that the pre-charge function can be realized, the charging time of the pixel circuit can be shortened, and the high refresh rate can be realized.

It should be noted that in various embodiments of the present disclosure, the gate drive circuit 20 is not limited to the cascade mode described in FIG. 9, but may be realized in any suitable cascade mode. When the cascade mode or the clock signal changes, the waveform overlapping portion of the output signals of the first scan signal output terminals OUT1 of the first to fourth stage shift register units A1-A4 will also be changed correspondingly in the display period, for example, overlapping 33% or 0% (i.e., non-overlapping), so as to meet various application requirements.

Figure 11:
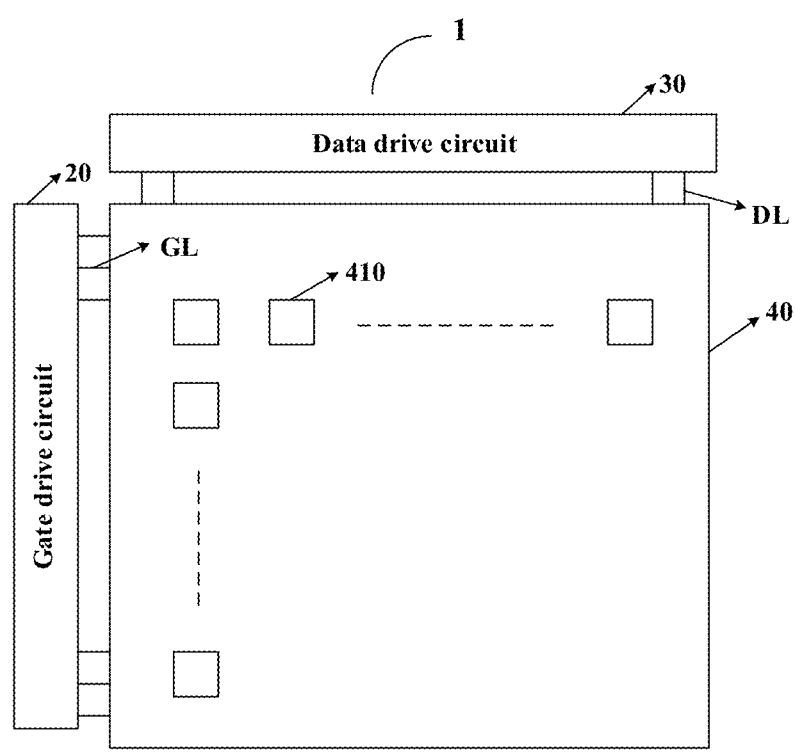
FIG. 11 is a schematic diagram of a display device according to at least an embodiment of the present disclosure.

An embodiment of the present disclosure also provides a display device 1. As shown in FIG. 11, the display device 1 includes a gate drive circuit 20 provided in any embodiment of the present disclosure. The display device 1 further includes a display panel 40 including an array of a plurality of sub-pixel units 410. For example, the display device 1 may further include a data drive circuit 30. The data drive circuit 30 is used for providing data signals to the pixel array; the gate drive circuit 20 is used to provide drive signals to the pixel array, for example, the drive signals may drive the scan transistors and the sense transistors in the sub-pixel units 410. The data drive circuit 30 is electrically connected to the sub-pixel units 410 through the data lines DL, and the gate drive circuit 20 is electrically connected to the sub-pixel units 410 through the gate lines GL.

It should be noted that the display device 1 in the embodiments of the present disclosure can be any product or component with a display function such as a liquid crystal panel, a liquid crystal television, a display, an OLED panel, an OLED television, an electronic paper display device, a mobile phone, a tablet computer, a notebook computer, a digital photo frame, a navigator, etc.

The technical effect of the display device 1 provided by any of the embodiments of the present disclosure may refer to the corresponding description of the gate drive circuit 20 in any of the above-described embodiments, and will not be described here again.

An embodiment of the present disclosure also provides a driving method that can be used to drive the shift register unit 10 provided by any of the embodiments of the present disclosure. For example, in one example, the driving method includes the following operations.

In the first stage, the first input circuit 110 inputs the first input signal to the first node Q1 in response to the first control signal, while the anti-leakage circuit 300 inputs the first voltage to the second node Q2 under the control of the level of the first node Q1.

In the second stage, the output circuit 400 outputs an output signal to the output terminal OUT under the control of the level of the first node Q1.

For example, in another example, the shift register unit 10 includes a blocking circuit 500, and the driving method further includes the following operation:

The blocking circuit 500 inputs a second voltage to the second node Q2 under the control of the level of the third node Q3, and the first voltage and the second voltage are different.

The technical effect of the driving method of the shift register unit 10 provided by any of the embodiments of the present disclosure may refer to the corresponding description of the shift register unit 10 in any of the above-described embodiments and will not be repeated here.

The following points need to be explained:

(1) The drawings of the embodiments of the present disclosure only refer to the structures related to the embodiments of the present disclosure, and other structures may refer to the general design.

(2) Without conflict, the embodiments of the present disclosure and the features in the embodiments can be combined with each other to obtain new embodiments.

The above description is merely an exemplary embodiment of the present disclosure and is not intended to limit the scope of protection of the present disclosure, which is determined by the appended claims.

What is claimed is:

1. A shift register unit, comprising a first input circuit, a first reset circuit, an anti-leakage circuit, a second input circuit, and an output circuit, wherein the first input circuit is connected to a first node and configured to input a first input signal to the first node in response to a first control signal;

the first reset circuit is connected to the first node and a second node and is configured to reset the first node in response to a reset signal;

the anti-leakage circuit is connected with the first node and the second node, and is configured to perform first control on a level of the second node under control of a level of the first node to reduce electrical leakage from the first node through the first reset circuit;

the output circuit includes an output terminal, and is connected to the first node and configured to output an output signal to the output terminal under control of the level of the first node; and the second input circuit is connected to the first node and configured to input a second input signal to the first node according to a second control signal, wherein the second input circuit comprises an electronic charging circuit, a storage sub-circuit, and an isolation sub-circuit, wherein the electronic charging circuit is connected to a blanking node and configured to input the second control signal to the blanking node in response to a third clock signal;

the storage sub-circuit is connected to the blanking node and configured to store a level of the second control signal input by the electronic charging circuit; and the isolation sub-circuit is connected to the blanking node and the first node, and is configured to input the second input signal to the first node under control of both a level of the blanking node and a second clock signal.

2. The shift register unit according to claim 1, wherein the anti-leakage circuit comprises a fourth transistor; and wherein a gate of the fourth transistor is connected to the first node, a first electrode of the fourth transistor is connected to the second node, and a second electrode of the fourth transistor is connected to a first voltage terminal to receive a first voltage.

3. The shift register unit according to claim 1, wherein the output terminal comprises a shift output terminal and at least one scan signal output terminal.

4. The shift register unit according to claim 3, wherein the output terminal comprises the shift output terminal and one scan signal output terminal, and the output circuit comprises a fifth transistor, a sixth transistor, and a first capacitor;

wherein a gate of the fifth transistor is connected to the first node, a first electrode of the fifth transistor is connected to a first clock signal terminal to receive a first clock signal as the output signal, and a second electrode of the fifth transistor is connected to the shift output terminal;

a gate of the sixth transistor is connected to the first node, a first electrode of the sixth transistor is connected to the first clock signal terminal to receive the first clock signal as the output signal, and a second electrode of the sixth transistor is connected to the scan signal output terminal; and a first end of the first capacitor is connected to the first node, and a second end of the first capacitor is connected to the shift output terminal.

5. The shift register unit according to claim 1, further comprising a first control circuit, wherein the first control circuit is connected to the first node and a third node and is configured to control the level of the third node under control of the level of the first node.

6. The shift register unit according to claim 1, further comprising a second reset circuit, wherein the second reset circuit is connected to the first node and configured to reset the first node in response to a blanking reset signal.

7. A gate drive circuit comprising a plurality of cascaded shift register units according to claim 1.

8. The gate drive circuit according to claim 7, wherein a display control end of a shift register unit of an (n+2)th stage is connected with a shift output end of a shift register unit of an n-th stage; and
a blanking control end of a shift register unit of an (n+1)th stage is connected with the shift output end of the shift register unit of the n-th stage,
where n is an integer greater than 0.

9. A display device comprising the gate drive circuit according to claim 7.

10. A driving method of a shift register unit according to claim 1, comprising:
in a first stage, the first input circuit inputting the first input signal to the first node in response to the first control signal, while the anti-leakage circuit inputs a first voltage to the second node under control of the level of the first node; and
in a second stage, the output circuit outputting the output signal to the output terminal under control of the level of the first node.

11. The driving method of the shift register unit according to claim 10, further comprising:
a blocking circuit inputting a second voltage to the second node under control of the level of a third node, wherein the first voltage and the second voltage are different.

12. The shift register unit according to claim 1, further comprising a blocking circuit, wherein the blocking circuit is connected to the second node and a third node, and configured to perform second control on the level of the second node under control of a level of the third node, wherein the first control is opposite to the second control.

13. The shift register unit according to claim 12, wherein the first reset circuit comprises a second transistor, a third transistor, and a twenty-third transistor,
a gate of the second transistor is connected to the third node, a first electrode of the second transistor is connected to the first node, and a second electrode of the second transistor is connected to the second node;
a gate of the third transistor is connected to a display reset terminal to receive a display reset signal, a first electrode of the third transistor is connected to the first node, and a second electrode of the third transistor is connected to the second node; and
a gate of the twenty-third transistor is connected to the display reset terminal to receive the display reset signal, a first electrode of the twenty-third transistor is connected to the second node, and a second electrode of the twenty-third transistor is connected to a second voltage terminal to receive a second voltage.

14. The shift register unit of claim 12, wherein the blocking circuit comprises a seventh transistor,
wherein a gate of the seventh transistor is connected to the third node, a first electrode of the seventh transistor is connected to the second node, and a second electrode of the seventh transistor is connected to a second voltage terminal to receive a second voltage.

15. The shift register unit according to claim 12, further comprising a second control circuit, wherein the second control circuit is connected to the third node and configured to control the level of the third node in response to the second clock signal.

16. The shift register unit according to claim 12, further comprising a third control circuit, wherein the third control circuit is connected to the third node and configured to control the level of the third node in response to the first control signal.

17. The shift register unit according to claim 12, further comprising an output noise reduction circuit, wherein the output noise reduction circuit is connected with the third node and configured to reduce noise at the output terminal under control of the level of the third node.

18. The shift register unit according to claim 17, wherein the output terminal comprises a shift output terminal and a scan signal output terminal, and the output noise reduction circuit comprises a thirteenth transistor and a fourteenth transistor,
wherein a gate of the thirteenth transistor is connected to the third node, a first electrode of the thirteenth transistor is connected to the shift output terminal, and a second electrode of the thirteenth transistor is connected to a second voltage terminal to receive a second voltage; and
a gate of the fourteenth transistor is connected to the third node, a first electrode of the fourteenth transistor is connected to the scan signal output terminal, and a second electrode of the fourteenth transistor is connected to a fifth voltage terminal to receive a fifth voltage.

* * * * *